(12) United States Patent
Minato et al.

(10) Patent No.: US 7,781,790 B2
(45) Date of Patent: Aug. 24, 2010

(54) METHOD FOR MANUFACTURING SUBSTRATE FOR SEMICONDUCTOR LIGHT EMITTING ELEMENT AND SEMICONDUCTOR LIGHT EMITTING ELEMENT USING THE SAME

(75) Inventors: Shunsuke Minato, Anan (JP); Junya Narita, Yoshinogawa (JP); Yohei Wakai, Anan (JP); Yukio Narukawa, Tokushima (JP); Motokazu Yamada, Tokushima (JP)

(73) Assignee: Nichia Corporation, Anan-shi (JP)

( * ) Notice: Subject to any disclaimer, the term of this patent is extended or adjusted under 35 U.S.C. 154(b) by 0 days.

(21) Appl. No.: 12/004,079

(22) Filed: Dec. 20, 2007

(65) Prior Publication Data

US 2008/0303042 A1    Dec. 11, 2008

(30) Foreign Application Priority Data

Dec. 21, 2006   (JP)   ............................. 2006-344482
Oct. 18, 2007   (JP)   ............................. 2007-271764

(51) Int. Cl.
    *H01L 33/00*    (2010.01)
(52) U.S. Cl. ............................. 257/98; 257/88; 257/95; 257/E33.001
(58) Field of Classification Search ............... 257/88, 257/95, 98
    See application file for complete search history.

(56) References Cited

U.S. PATENT DOCUMENTS

| | | | | |
|---|---|---|---|---|
| 6,657,236 | B1 * | 12/2003 | Thibeault et al. | ............... 257/98 |
| 6,940,098 | B1 | 9/2005 | Tadatomo et al. | |
| 2001/0031514 | A1 * | 10/2001 | Smith | ......................... 438/107 |
| 2002/0123164 | A1 * | 9/2002 | Slater et al. | .................... 438/39 |
| 2003/0057444 | A1 | 3/2003 | Niki et al. | |
| 2004/0048471 | A1 | 3/2004 | Okagawa et al. | |
| 2004/0113166 | A1 | 6/2004 | Tadatomo et al. | |
| 2005/0179130 | A1 | 8/2005 | Tanaka et al. | |

FOREIGN PATENT DOCUMENTS

| | | |
|---|---|---|
| JP | 2000-331937 A | 11/2000 |
| JP | 2001-53012 A | 2/2001 |
| JP | 2002-164296 A | 6/2002 |
| JP | 2002-280609 A | 9/2002 |
| JP | 2002-280611 A | 9/2002 |
| JP | 2002-289540 A | 10/2002 |

(Continued)

OTHER PUBLICATIONS

Yu, "Recent R&D Trend and Strategies in Korean LED/Solid-State Lighting Industry", 2007 Taiwan Solid State Lighting, slide 1 to 8.

*Primary Examiner*—Wai-Sing Louie
(74) *Attorney, Agent, or Firm*—Birch, Stewart, Kolasch & Birch, LLP

(57) ABSTRACT

A semiconductor light emitting element having a semiconductor light emitting structure on a first main surface of a substrate, wherein the first main surface of the substrate has a substrate protrusion portion thereon, wherein a bottom surface of a protrusion is wider than a top surface thereof in a cross section of the substrate and the top surface is included in the bottom surface in a top view of the substrate, the bottom surface has an approximately polygonal shape which has a convex portion on each constituent side of the bottom surface, and the top surface has an approximately circular shape.

15 Claims, 14 Drawing Sheets

FOREIGN PATENT DOCUMENTS

| | | |
|---|---|---|
| JP | 2003-318441 A | 11/2003 |
| JP | 2005-47718 A | 2/2005 |
| JP | 2005-064492 A | 3/2005 |
| JP | 2005-101230 A | 4/2005 |
| JP | 2005-101566 A | 4/2005 |
| JP | 2005-136106 A | 5/2005 |
| JP | 2005-314121 A | 11/2005 |
| JP | 2006-066442 A | 3/2006 |

* cited by examiner (a)

(b)

(a)

(b)

(a)

(b)

(c)

(a)

(b)

(a)

(b)

(a)

(b)

METHOD FOR MANUFACTURING SUBSTRATE FOR SEMICONDUCTOR LIGHT EMITTING ELEMENT AND SEMICONDUCTOR LIGHT EMITTING ELEMENT USING THE SAME

BACKGROUND OF THE INVENTION

1. Technical Field

The present invention relates to a semiconductor device having a recess or protrusion (hereinafter may be referred to as recess/protrusion) provided on a substrate and, more particularly, to a semiconductor light emitting element that improves its external quantum efficiency by having the recess or protrusion provided on the substrate, and a substrate used therein and a method of manufacturing them.

2. Background Art

A semiconductor element, i.e., a light emitting diode (LED) basically comprises an n-type semiconductor layer, an active layer and a p-type semiconductor layer stacked on a substrate in this order, and electrodes are formed thereon. Light from the active layer is discharged outside of the element from such as outwardly exposed surfaces (top surface, side surface) of the semiconductor structure and exposed surfaces (back surface, side surface) of the substrate.

In detail, when light generated in the semiconductor layer enters an interface with an angle of incidence not smaller than the critical-angle with respect to the interfaces with the electrodes or the interface with the substrate, the light laterally propagates while repeating total reflection within the semiconductor layer.

A part of light is absorbed during the propagation, resulting in lower external quantum efficiency.

A method of roughing the top surface and side surfaces of the light emitting diode chip has been proposed, but it may cause damage on the semiconductor layer and results in cracks and/or other trouble. This leads to partial breakage of p-n junction and reduction in internal quantum efficiency. Accordingly, provision of recess/protrusion on a surface of a substrate of a semiconductor growing side has been considered.

Methods for providing the recess/protrusion on a growth surface of a substrate have been described in literatures below. With reference to Patent Literature 3 are: Japanese Laid Open Patent Publication Nos. 2006-066442, 2005-064492, 2005-101230, 2005-136106, and 2005-314121; and with reference to Patent Literatures 4 and 5 are: Japanese Laid Open Patent Publication Nos. 2000-331937, 2002-280609, and 2002-289540.

Patent Literature 1: Japanese Laid Open Patent Publication No. 2003-318441,

Patent Literature 2: Japanese Laid Open Patent Publication No. 2005-101566

Patent Literature 3: Japanese Laid Open Patent Publication No. 2005-047718

Patent Literature 4: Japanese Laid Open Patent Publication No. 2002-164296

Patent Literature 5: Japanese Laid Open Patent Publication No. 2002-280611

Patent Literature 6: Japanese Laid Open Patent Publication No. 2001-053012

Each of the patent literatures 1-6 discloses provision of the recess/protrusion on the growth surface of the substrate. Patent Literature 3 and the above-described reference literatures describe provision of an etch pit in the sapphire substrate by wet etching using phosphoric acid.

When an optical structure having light extracting feature is provided on the semiconductor structure side of the substrate surface the crystallinity of the semiconductor grown thereon may be degraded due to the recess/protrusion configuration, because the surface also functions as a crystal growth surface. In addition, if a void is present in the recess provided in the substrate, light extraction efficiency may be decreased. Also, even if the substrate surface has a structure capable of improving the light extraction efficiency, the directional characteristics of emission may be adversely affected.

SUMMARY OF THE INVENTION

The present invention provides a substrate for a light emitting element and light emitting element which are excellent in crystallinity and light extraction efficiency, and a method of manufacturing them.

A semiconductor light emitting element according to an embodiment of the present invention has a semiconductor light emitting structure on a first main surface of a substrate. A protrusion portion is provided on the first main surface of the substrate. A protrusion has a shape in which the bottom surface is wider than the top surface in its cross section or the bottom surface includes the top surface in the top view of the substrate, the bottom surface has an approximately polygonal shape, and the top surface has an approximately circular or polygonal shape having constituent sides (hereinafter may be referred to as "sides") more than that of the bottom surface.

In another embodiment according to the above-described embodiment, (1) each side surface of a protrusion is formed with a complex surface comprising more surfaces than that of the number of constituent sides of the approximately polygonal bottom surface.

A semiconductor light emitting element according to an embodiment of the present invention has a semiconductor light emitting structure on a first main surface of a substrate. A protrusion portion is provided on the first main surface of the substrate. A protrusion has a shape in which the bottom surface is wider than the top surface in its cross section or the bottom surface includes the top surface in the top view of the substrate, the shape of the bottom surface is approximately polygonal, the top surface is approximately polygonal having the number of constituent sides the same or less than that of the bottom surface, and a side surface of the protrusion is formed with a complex surface made with more surfaces than the number of constituent sides of the approximately polygonal bottom surface.

In other embodiments according to each of the above-described embodiments, (1) In the first main surface, the substrate protrusion portion includes a plurality of protrusions that are spaced apart each other. (2) In the first main surface of the substrate, the protrusions are arranged periodically. (3) the periodic arrangement of the protrusions is triangular, quadrangular, or hexagonal lattice, and (4) the shape of the bottom surface is approximately triangular.

A method of manufacturing a semiconductor light emitting element according to an embodiment of the present invention comprises a process of providing a mask on a first main surface of a substrate, a process of forming a recess/protrusion structure on the substrate in which a plurality of protrusions having different shapes at the top surface and the bottom surface are formed spaced apart from each other by etching the substrate through the mask, and a process of forming a semiconductor substrate by growing a semiconductor on the surface of the protrusions or recesses of the substrate.

Other embodiments according to the embodiments described above include: (1) the process of providing a mask at least includes processes of providing a first mask which defines the shape of the bottom surface of protrusions and providing a second mask which defines the shape of the top surface of the protrusions; (2) the etching used in the process of forming the recess/protrusion structure is wet etching, and the shape of the bottom surface of the protrusions includes the substrate crystal shape defined by the wet etching; (3) the bottom surface of a protrusion is wider than that of the top surface in the cross sectional view of the substrate, or the bottom surface of a recess includes the top surface thereof in plane view of the substrate, in which the shape of the bottom surface is approximately polygonal, the top surface is approximately circular or approximately polygonal with the sides more than that of the bottom surface; (4) the shape of the mask is approximately circular and the shape of the bottom surface is approximately a curve of constant width or Reuleaux polygon; and (5) in the first main surface of the substrate, the protrusions are arranged periodically and the periodic arrangement is triangular, quadrangular, or hexagonal lattice.

The semiconductor light emitting element of the present invention is capable of preferable light extracting by the optical structure of the substrate thereof. Further, in a manufacture of the substrate of the element having a complicated shape with excellent optical properties, the number of processes is not needed to be increased while exhibiting excellent mass productivity. Moreover, in a manufacture of the element, suitable semiconductor crystal growth can be realized even with a surface having a recess or protrusion by combining specific shapes of top surface and bottom surface or side surfaces thereof. Accordingly, the invention can be applied to other semiconductor elements.

DETAILED DESCRIPTION OF THE PREFERABLE EMBODIMENTS

Figure 1A:
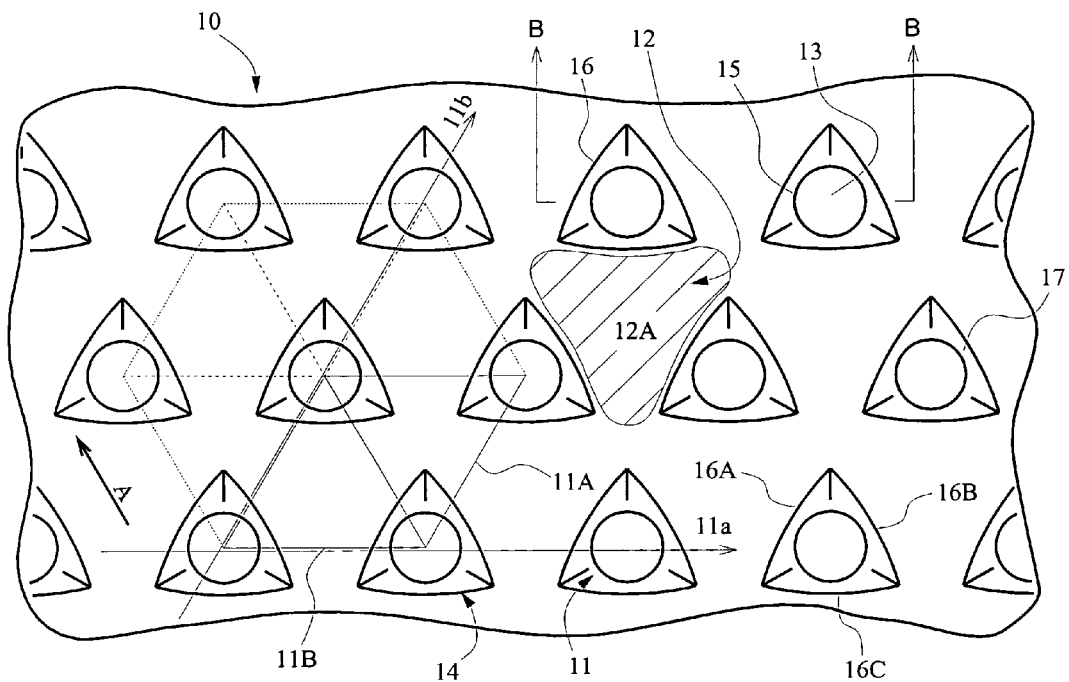
FIG. 1A is a schematic plan view illustrating a substrate according to an embodiment of the present invention.

The preferred embodiments of the present invention will be described below with reference to the accompanying drawings. However, the light emitting elements and light emitting devices discussed below are merely given to embody the technological concept of the present invention, and the present invention is not limited thereto. Unless otherwise specified, the sizes, materials, shapes, relative layouts, and so forth of the constituent members are for illustrative examples, and do not intend to limit the invention therein. The sizes, positional relationships, and so forth of the members shown in the drawings may be exaggerated for clarity. In each constituting component of the present invention, multiple components may be constructed using the same member so that one member can serve as multiple components, or vice versa, a function of a member may be shared by multiple members.

Embodiment 1

Semiconductor Light Emitting Element and Substrate Thereof

Figure 9:
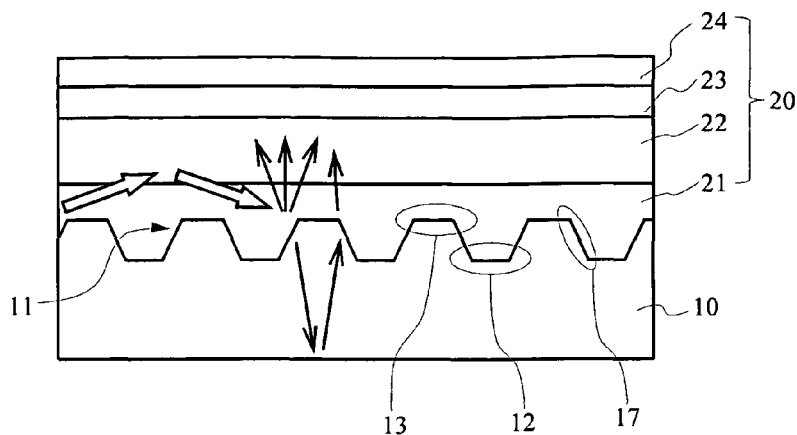
FIG. 9 is a schematic cross sectional view illustrating a function of a substrate and a light emitting element according to an embodiment of the present invention.

A semiconductor light emitting element of the present invention has, as shown in FIG. 9 and the like, basically, a light emitting element structure made of a semiconductor layered structure 20 is provided on a substrate 10. A structure having optical function such as reflection and/or refraction of light corresponding to light from the light emitting element is provided mainly on a semiconductor side of a semiconductor growth substrate 10 (a first main surface). Specifically, as shown in FIG. 9, a recess/protrusion structure 11 is provided on a first main surface of the substrate. The recess/protrusion forms an interface having an optical function with a semiconductor having different refractive index than that of the substrate so as to reflect and/or refract light propagating in lateral direction (shown by an outline arrow in the figure) at the recesses or protrusions, especially at an inclined side surface, as indicated by arrows in the figure. A semiconductor having a structure of light emitting element is provided on the substrate via an under layer if needed.

Figure 1B:
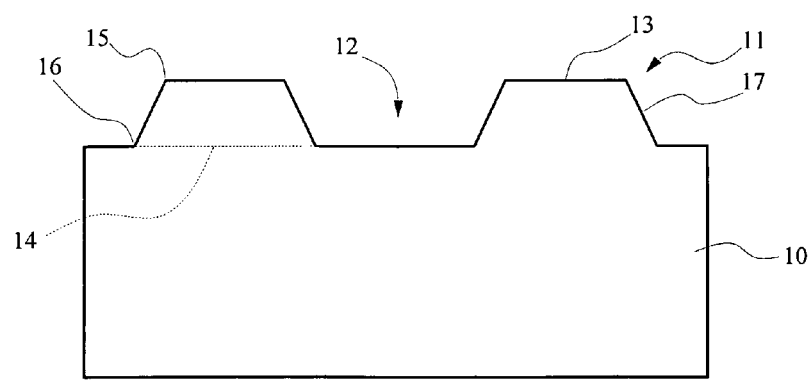
FIG. 1B is a schematic cross sectional view taken along a section line B-B of FIG. 1A.
Figure 2:
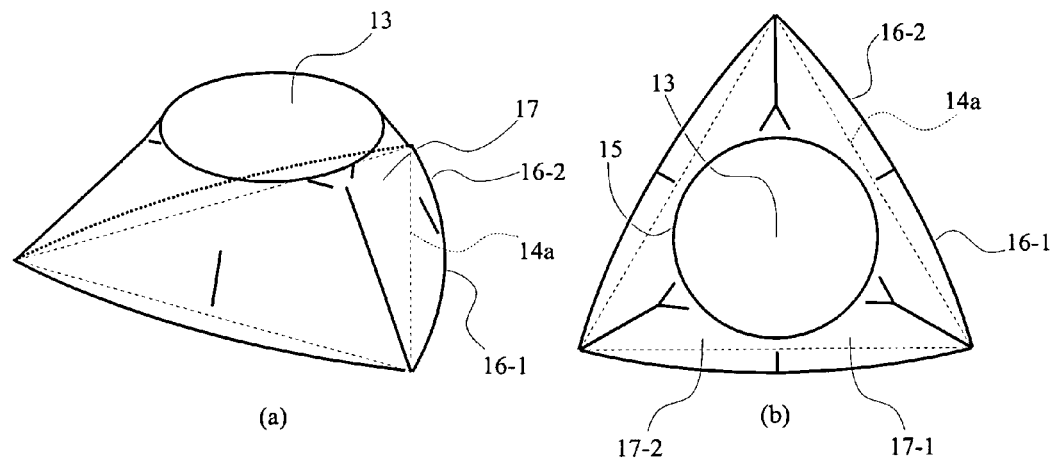
FIG. 2(*a*) is a schematic perspective view and FIG. 2(*b*) is a schematic plan view each illustrating a recess/protrusion (a protrusion) of a substrate according to an embodiment of the present invention.
Figure 3:
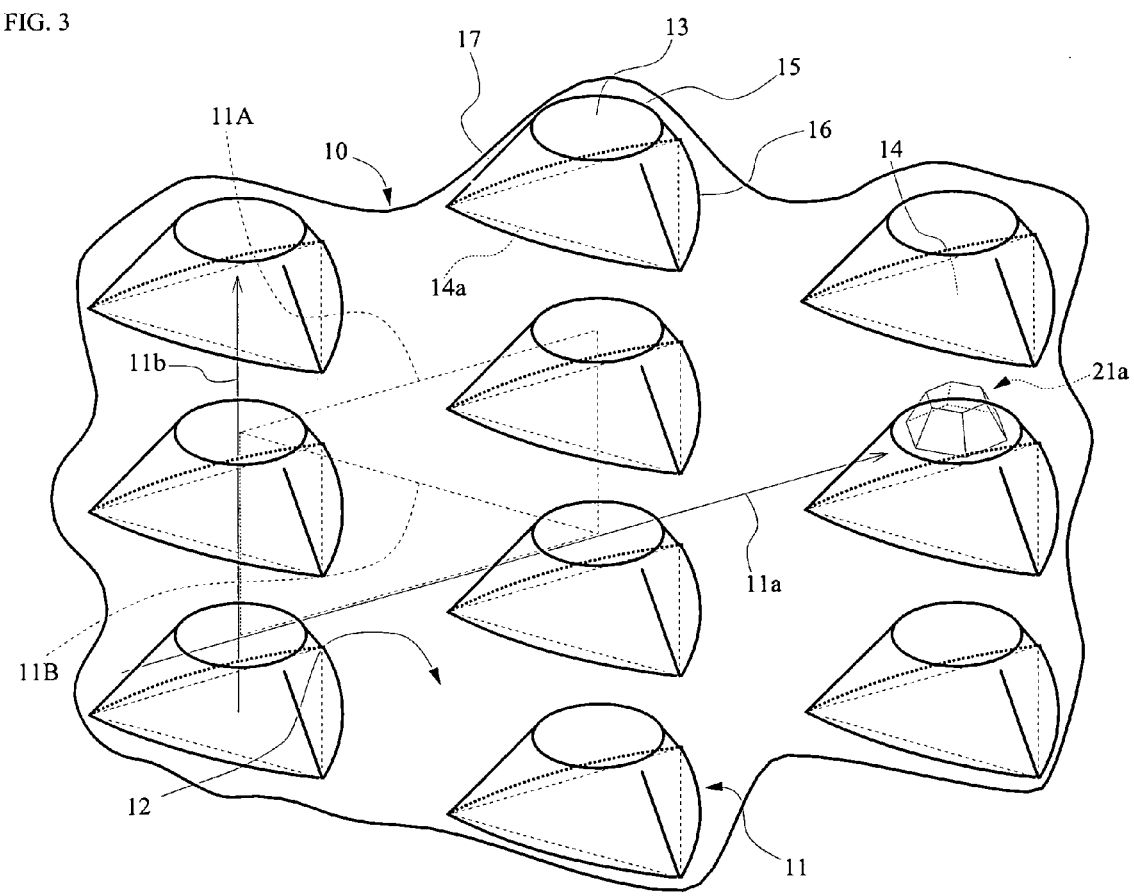
FIG. 3 is a schematic perspective view illustrating a substrate according to an embodiment of the present invention.

Specifically in planar view, as an example according to Example 1 and shown in FIGS. 1 to 3, a protrusion preferably has different shapes at its bottom and top surfaces, in particular, the contours of the surfaces are different each other, such as, an approximately triangular bottom surface 14 and an approximately circular top surface 13. Especially, as in this example, a shape preferably includes a polygonal bottom surface, a top surface having a polygonal shape with a larger number of constituent sides than that of the bottom surface, preferably an approximately circular shape, and a side surface having a larger number of surfaces than the number of constituent sides of the bottom surface. In an element having a light emitting structure on its substrate, light traverses in various directions in the substrate surface. In this regard, preferable irregular reflection and/or diffraction of light tend to be obtained by the protrusions located at a deeper portion of the substrate (bottom surface 12 of a recess) and their inclined side surfaces 17 protruding from the bottom surface. In addition, because the top surface side shows less directional dependence and greater order of rotational symmetry to the light in various directions than that of the bottom or side surfaces side, directional deviation of light tend to be suppressed at the top surface side. In the present embodiment, FIG. 1A is a schematic planar view illustrating shapes and arrangement of protrusions 11 provided on the surface of the substrate 10, and FIG. 1B is a schematic cross sectional view illustrating a part of a cross section thereof. FIG. 2(*a*) is a schematic perspective view and FIG. 2(*b*) is a plan view each illustrating a shape of a protrusion 11 in detail. FIG. 3 is a schematic perspective view illustrating protrusions 11 provided on the substrate surface.

In detail, as shown in FIG. 2, the bottom surface 14 has a shape convex outwardly with respect to the triangle 14*a* shown in dotted lines connecting the three tips of the bottom surface 14 in the figure. Two side surfaces 17-1, 17-2 and two constituent sides 16-1, 16-2 of the bottom surface are provided to each side of the triangle 14*a*. The structure described above is preferable because the optical performance described above can be improved by providing a greater number of side surfaces and inclined surfaces than the number of constituent sides 14*a* which connect vertexes of the bottom surface of a protrusion; that is, a complex surface formed of a plurality of side surfaces and inclined surfaces. In this example, a surface similar to sapphire R-plane can be obtained with the constituent sides 16-1 and 16-2. Herein, vertexes at the bottom surface are formed with a smaller angle than that of the vertexes of sides 16-1 and 16-2 of the complex surface.

Figure 4:
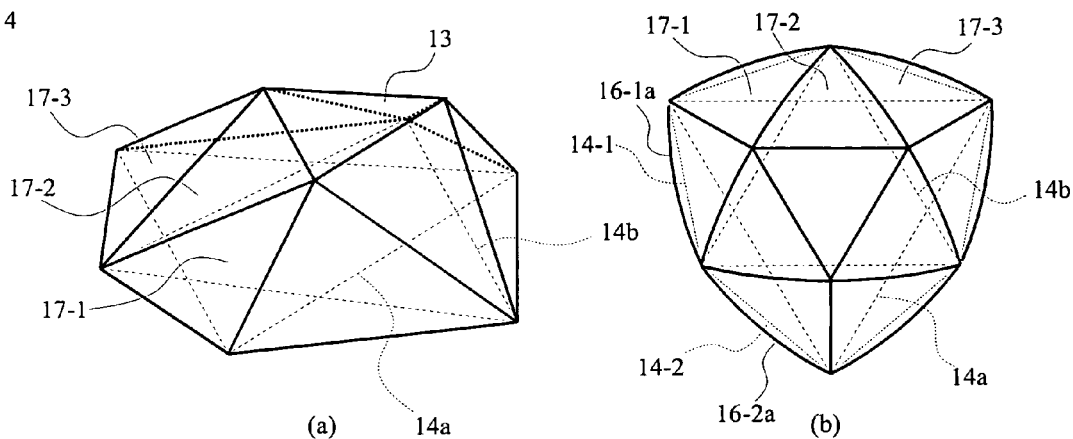
FIG. 4(*a*) is a schematic perspective view and FIG. 2(*b*) is a schematic plan view each illustrating a recess/protrusion (a protrusion) of a substrate according to an embodiment of the present invention.

Other examples of the shape of the protrusion 11 provided on the substrate include the shapes shown in FIG. 4. In the example shown in FIG. 4, the top surface 13 of a protrusion is triangular and the bottom surface 14 of the protrusion is hexagonal formed by connecting respective vertexes of two triangles 14*a* and 14*b* which are formed by connecting respective vertexes. FIG. 4(*a*) is a schematic perspective view and FIG. 4(*b*) is a schematic plan view of a protrusion of Example 2. The triangular shapes 14*a* and 14*b* at the bottom of the protrusion may be approximately the same size as shown in FIG. 4(*a*), one of triangular shape 14*a* may be larger than the other triangular shape as shown in FIG. 4(*b*), which is the case in Example 2. In this example, the larger triangular shape 14*a* at the bottom surface has approximately the same vertex direction, which is the direction from the median point to the vertex, as that of the triangular shape of the top surface 13 of the protrusion. The other triangular shape 14*b* at the bottom surface has opposite vertex direction that is a direction rotated at 180° with respect to the triangular shape of the top surface 13 of the protrusion. In this example, the number of the side surfaces is larger than the number of constituent sides of the hexagonal shape of the bottom surface 14 of the protrusion. With a complex surface as described above, optical directivity tends to be improved.

As will be described in Example 2, relative to the crystal shape of the substrate, that is triangular in the present Example, the mask is formed in a polygonal shape having a larger number of constituent sides or an approximately circular shape. The protrusions are formed with a shape in which the shape of the top surface is similar to the shape of the mask and is different from the crystal shape of the substrate, and the shape of the bottom surface is similar to the crystal shape of the substrate and different from the shape of the mask. That is, corresponding to two principal shapes of the mask and crystal shape of the substrate, the shape of the bottom surface which is located distant from the mask depends more on the crystal shape of the substrate and the shape of the top surface which is located in the vicinity of the mask depends more on the shape of the mask. That is, the degree of dependence on the crystal shape of the substrate has a gradient that is higher in a portion closer to the bottom surface than a portion closer to the top surface on which the mask is provided. By utilizing the dependency, the present invention provides a configuration that improves properties such as light emitting properties and crystallinity. As the wet etching progresses, the shape of the bottom surface becomes triangular similar to the shape 14*a* of the substrate crystal. Therefore, in the examples shown in FIGS. 1 and 13, the etching is stopped before forming such a shape to form the bottom surface with a shape that is wider in cross-section and area than that of the crystal shape 14*a*. At the same time, due to the circular shape of the mask, a convex planar portion is formed along each side of the crystal shape of the substrate 14*a*. That is, each side of the crystal shape 14*a* of the substrate defined by the wet etching projects outwardly to form a convex portion. In a similar manner, the convex portions are formed in the top surface in an example shown in FIG. 13, in which the degree of projection and curvature of the convex portions are larger than that of the bottom surface sides.

For example, in Examples 1 and 2 to be hereinafter described, the top surface of the protrusion portion has approximately the same shape as that of the mask, in particular, a similar shape to the mask, because the corrosion proceeds inwardly from the circumference of the mask. Therefore, as the etching proceeds, the circumference of the protrusion portion approaches to the approximate triangular shape 14*a* of the substrate crystal. Thus, the shape of the bottom surface side becomes very similar (Example 1, FIG. 1) to, and on the other hand, it becomes dissimilar (Example 2, FIG. 4) to that of the crystal shape. The top surface 13 side of the protrusion may be formed to be in the course of changing from the mask shape to the substrate shape. That is, as shown in Example 4 and FIG. 13, the shape can be of an intermediate shape between the mask shape and the substrate shape (triangle 13a in the figure). Further, as shown in FIG. 4, the protrusion can be formed such that the side surfaces include multiple surfaces to formula three-dimensional configuration that is an intermediate shape between the shapes of the top surface and bottom surface, incorporating the configurations of the top surface and bottom Surface. The side surfaces may be formed in a similar manner as that of the top surface and the bottom surface.

Moreover, as in the examples to be described hereinafter, the bottom surface is formed in a shape similar to the shape of the mask (circular or triangular shape) than a triangular shape 14a which is the shape of the crystal, but the shape thereof is not limited thereto and the etching may be further proceeded to form approximately the same shape as the triangle 14a. However, an intermediate shape is preferable rather than the shape of the substrate crystal because an in-plane orientation dependence of the crystal and emission can be suppressed with the intermediated shape so that the crystal and radiation properties can be improved. Further, a shape which is approximately a curve of constant width or Reuleaux polygon to be described hereinafter is more preferable.

As shown in Examples 1 and 4, when the shape of the mask is approximately a curve of constant width such as approximately a circle and the bottom surface side is an intermediate shape between the shapes of the mask and substrate crystal, similarly, a shape which is approximately a curve of constant width or a similar shape thereto can be formed. In Examples 1 and 4, the shape of the substrate crystal is approximately triangular 14a, so that the shape of the bottom surface is approximately a Reuleaux triangle or a similar shape thereof. Thus, when the shape of the substrate crystal is a regular polygon and the shape of the mask is approximately a curve of constant width, in particular, when the shape of the mask is approximately circular and the shape of the substrate crystal is a regular polygon, the bottom surface side can be formed in a shape which is approximately a curve of constant width or Rauleaux triangle, or a similar shape thereto. Also, as in Example 4 to be described hereinafter, when the top surface side has an intermediate shape between the shapes of the mask and substrate crystal as in the bottom surface side, the shapes of the top surface and bottom surface may be approximately a curve of constant width or Reuleaux polygon (which is an odd-numbered polygon). Examples of the shapes similar to that described above include such as approximately a Reuleaux polygon with rounded corners as the top surface 13 of the protrusion in FIG. 13, and shapes in which a part of the curved sides and corners fragmented to form a polygonal line.

Figure 13:
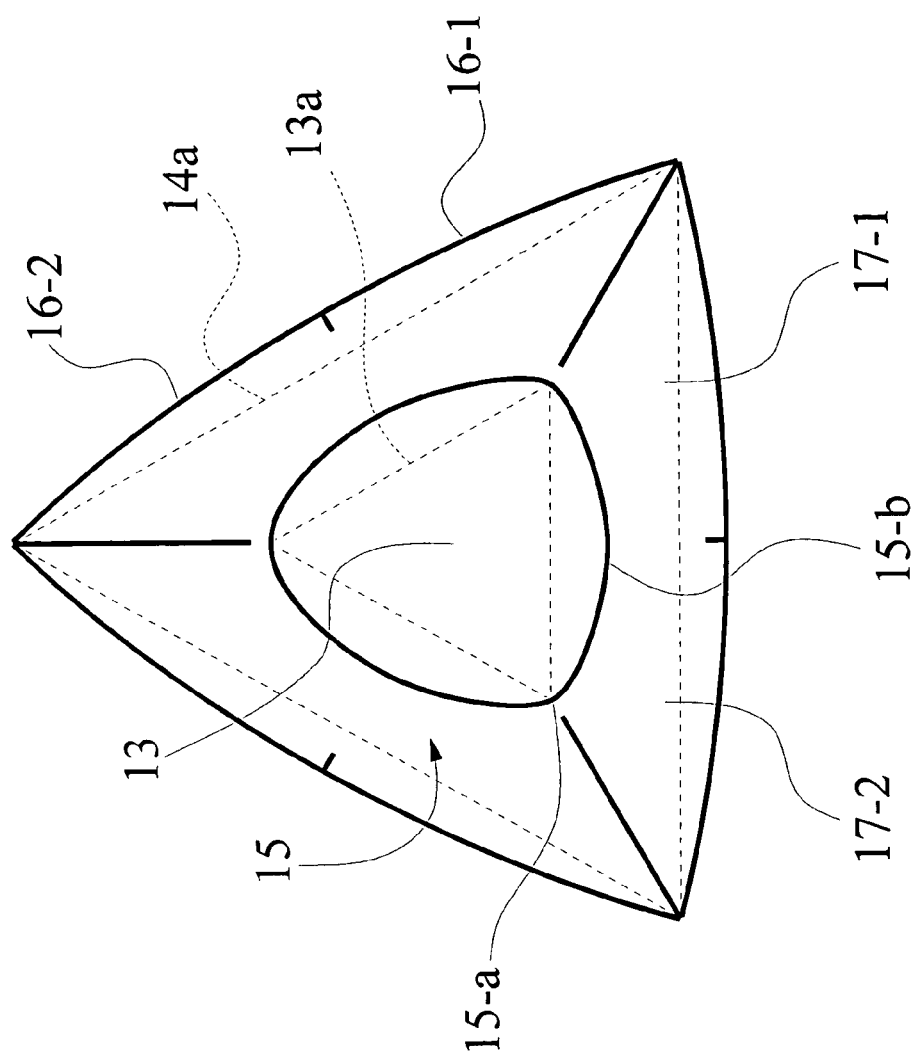
FIG. 13 is a schematic plan view illustrating a recess/ protrusion (a protrusion) of a substrate according to an embodiment of the present invention.

As described above, whether the shape of the top surface side or the bottom surface side is an intermediate shape between the shapes of the mask and the substrate crystal, or whether the top surface and the bottom surface of the protrusion portion have different constituent sides, can be determined by the degree of diversion from their nominal contour that is either the shape of the mask or the shape of the substrate crystal. For example, from the ratio between the circumference lengths (circumference length of the top surface or bottom surface)/(circumference length of the nominal contour of the top surface or the bottom surface) respectively, or the ratio between the areas (area of the top surface or bottom surface)/(area of the nominal contour of the top surface or the bottom surface) respectively. If such a ratio is larger than 1, the number of constituent sides of a top surface side is larger than that of a bottom surface side, when each intermediate shape has multiple sides. In this case, the nominal contour 13a of the top surface preferably has an approximately the same contour as the nominal contour 14a of the bottom surface, as shown in FIG. 13.

Here, various shapes of the substrate crystal can be formed by selecting the substrate material, planar orientation thereof, and etchant. In the case where a dry etching is used, the shape at the substrate side can be formed in a similar manner as in the substrate crystal shape, by adjusting the mask shapes for the upper portion and for the lower portion as shown in FIG. 7B.

Figure 6:
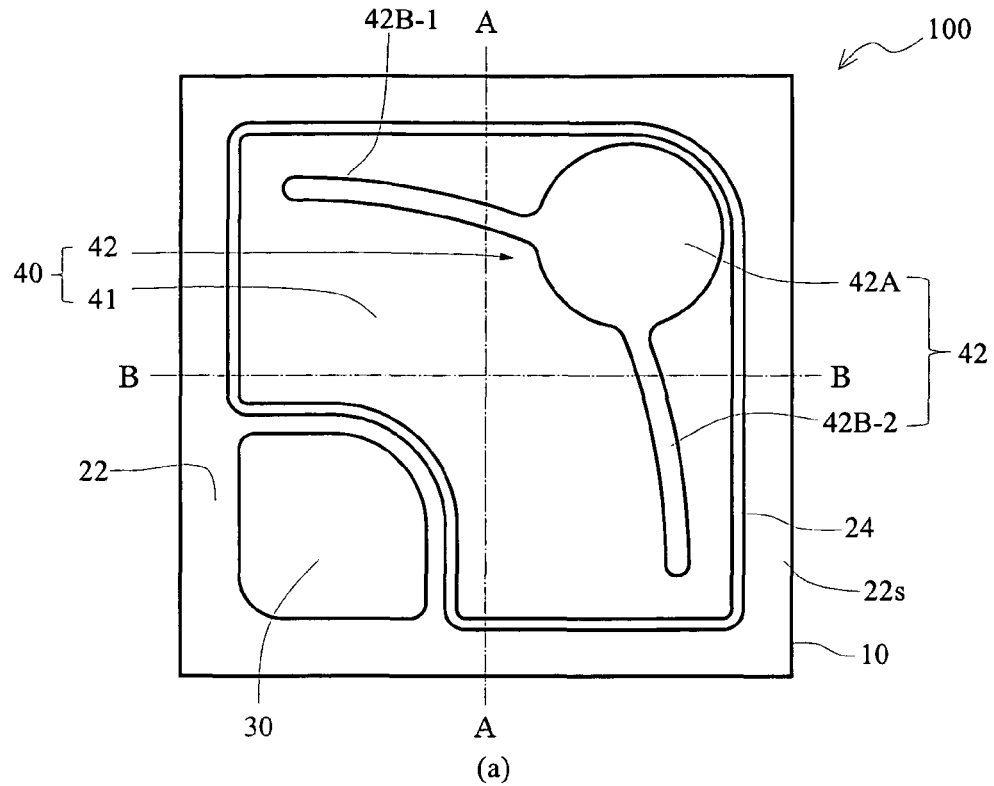
FIG. 6(*a*) is a schematic plan view illustrating a light emitting element and FIG. 6(*b*) is a schematic plan view illustrating a substrate of the light emitting element according to an embodiment of the present invention.
Figure 6:
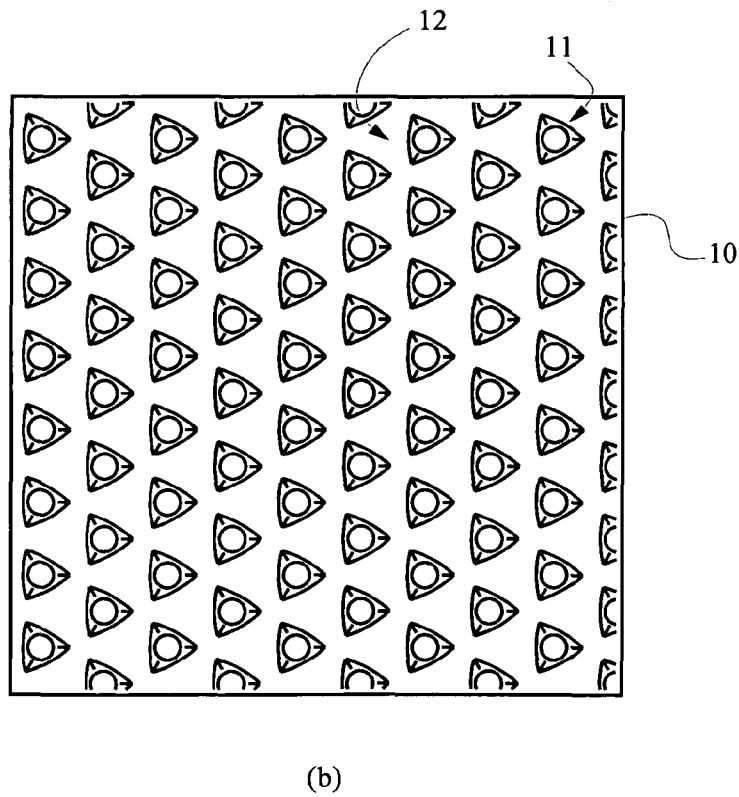

Moreover, protrusions 11 on the substrate are preferably arranged so that a plurality of protrusions are provided spaced apart from each other, as shown in FIGS. 1 to 3 and the like. Herein, the protrusions may be arranged irregularly. However, an arrangement with high density is preferable to obtain a suitable light emitting element, and a regular arrangement is preferable to obtain suitable directivity. Periodic arrangement of the protrusions 11 may be a hexagonal lattice (arranged at each tip of parallelogram 11A or two triangles 11B) as shown in FIGS. 1 to 3. The arrangement may also be in triangular lattice, quadrangular lattice and the like, or in a circular pattern and the like. Each of the protrusion is arranged at each lattice point of a periodic arrangement. Moreover, the periodic or orderly arrangement is preferably formed on the entire surface of the substrate. However, multiple regions (each having a regular arrangement) may be provided in which a regular arrangement is provided in some regions and a recess-protrusion structure is not provided in other regions, or a different arrangement thereof in which an irregular arrangement and a regular arrangement are provided. For example, a long-period regular arrangement, in which an arrangement having a region including regular and irregular structures and a region of a planar surface of the substrate, may be employed. The periodic arrangement may have basic units 11A, in each of which the protrusions are arranged as described above, aligned in its axial directions 11a, 11b. In the illustrated example, a quadrangular shape (hexagonal lattice) is periodic arrangement of the basic units 11A. When the planar shape of the protrusion is dissymmetric, the directivity of light can be controlled by also adjusting the direction of the shape. For example, as shown in FIG. 6, the directivity of light can be controlled by setting a desired relationship between the structures of the light emitting element and electrodes and their configuration, and the direction of an approximately triangular bottom surface of the protrusion portion. The direction may be either aligned in one direction as in the arrangement of the protrusions described above, or arranged irregularly or regularly. Desired crystallinity and optical properties can be obtained by adjusting the direction. Arranging the protrusions in one direction as shown in FIG. 6 is preferable because a suitable crystallinity and optical properties can be obtained thereby.

Figure 15:
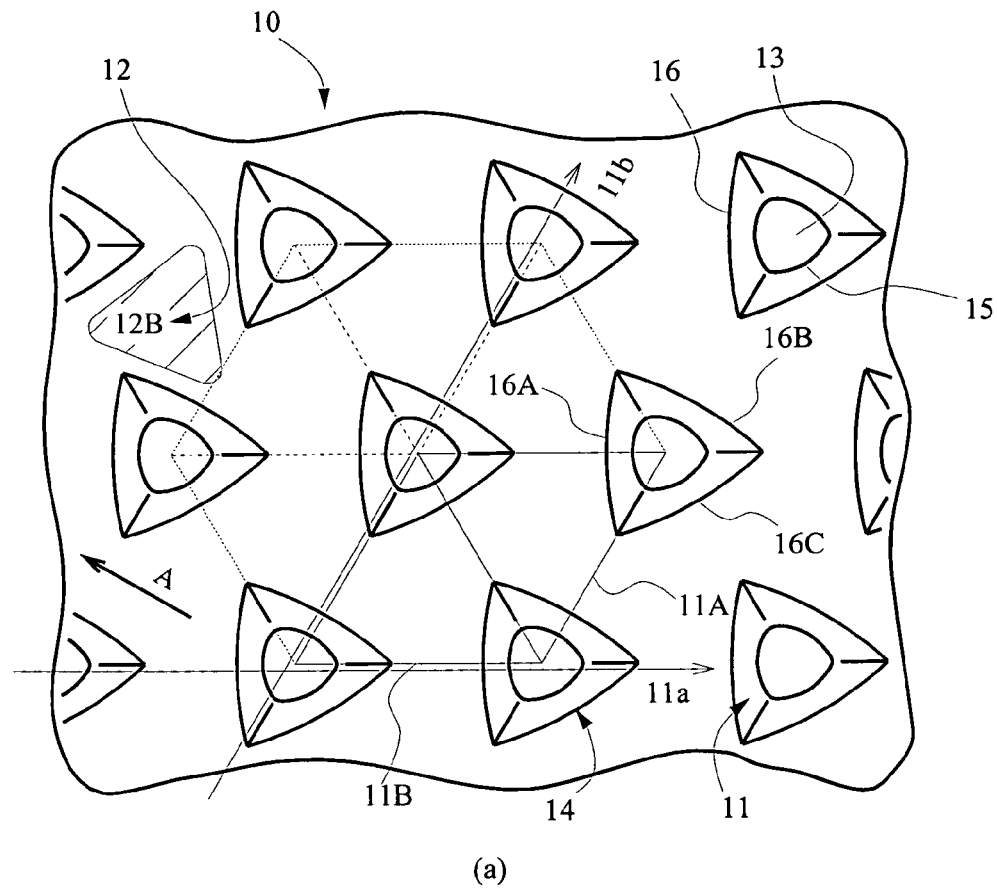
FIGS. 15(*a*) and 15(*b*) are schematic plan views respectively illustrating a substrate according to an embodiment of the present invention.
Figure 15:
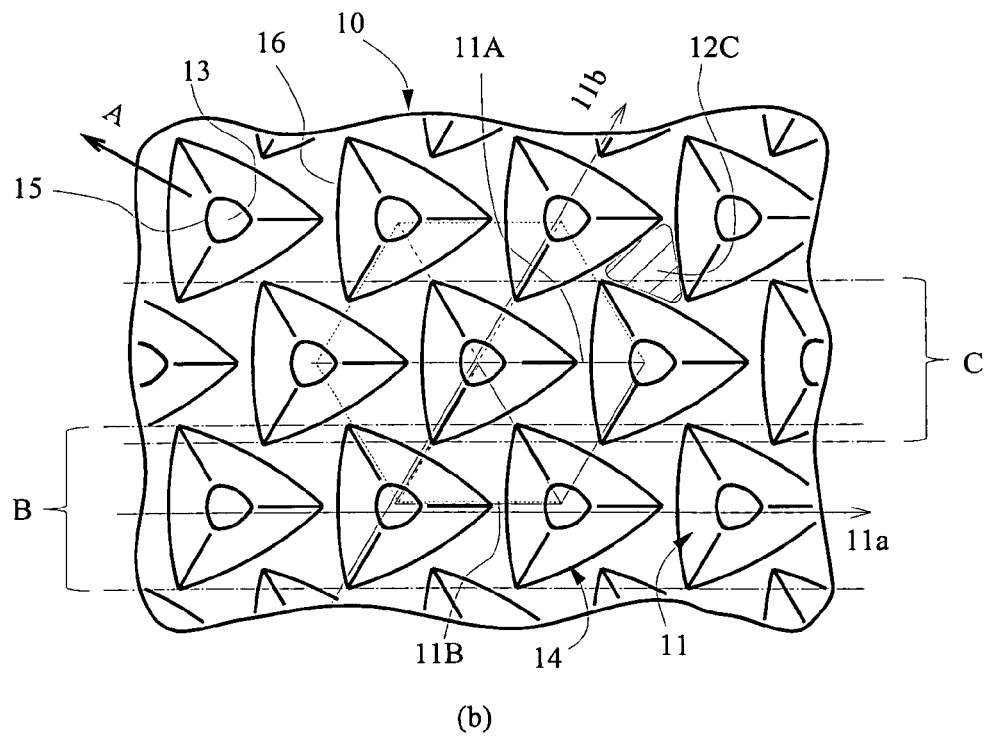

Specific examples of the configuration of the protrusions of the substrate include structures shown in FIG. 15 and Examples 5, 6 to be hereinafter described, as well as the structure shown in FIG. 1. The difference in structure between the embodiment shown in FIG. 1 and FIG. 15 is that the direction of the protrusions with respect to the axial directions 11a, 11b. Specifically, the facing directions of the constituent sides and vertex of the bottom surface of the protrusions with respect to the aligning directions of the protrusions are different. As an example shown in FIG. 1, each protrusion includes constituent sides 16C, 16A that are approximately in parallel with the two aligning directions 11a, 11b respectively, and each of the vertex directions thereof incline to the corresponding aligning direction. In the examples shown in FIG. 15, each protrusion includes constituent sides 16A to 16C, that incline to the two aligning directions 11a, 11b respectively, and each of the vertex directions thereof is approximately in parallel with the corresponding aligning direction. As the examples shown in FIG. 15, if the bottom surface is approximately triangular, the aligning directions are preferably approximately in parallel with respective vertex directions.

An alignment structure of the protrusions having a region with high density in terms of reflecting light can be formed with the constituent sides inclining toward the aligning direction as an embodiment shown in FIG. 15. Specifically, the protrusions are arranged along the aligning direction, and regions between adjacent rows of the protrusions have a low density of the protrusions, so that regions with a low density in terms of reflecting light can be formed. Especially, as in the example shown in FIG. 1, if the constituent sides 16A and 16C that are approximately in parallel with respective alignment directions, reflectivity of light decreases in the regions between the rows of the protrusions, so that regions with further lower density may be formed. Here, such regions between the rows of the protrusions or regions having a low density in terms with reflecting light are provided in an aligning direction. Due to the rotational symmetry, a third direction is provided in the examples shown in FIGS. 1, 15, that is 120° rotated from the direction 11a, and at an angle with or inclining toward the two aligning directions 11a, 11b of the triangular shapes in the figures. Meanwhile, as in the example shown in FIG. 15, if the constituent sides 16A to 16C are provided inclined toward the aligning direction, the inclined sides reflect light that is travelling in the direction of the row. Further, the effect can be increased by narrowing the distance among the rows of the protrusions. Specifically, the distance among the rows are preferably made narrower, such as from that shown in FIG. 15(a) to that shown in FIG. 15(b). For example, as shown in FIG. 15(b), when adjacent rows B,C of the protrusions are to be provided with respect to the aligning direction 11a, the width of the interval between the rows is set narrower than that of the rows B,C. That is, the width of a region between the rows of protrusions is preferably made narrower than the width of a row of protrusions in one aligning direction so that a part of the adjacent rows of the protrusions overlap each other. Moreover, it is preferable to apply such arrangement in all aligning directions.

Here, it is preferable to provide a constituent side which is inclined with respect to at least one of the aligning direction. More preferably, all of the constituent sides are inclined. Moreover, it is preferable that at least one constituent side, more preferably all of the constituent sides are inclined with respect to two aligning directions. Particularly, among the constituent sides, the inclined constituent sides are preferably provided adjacent to the regions between the rows of the protrusions. In the present specification, the term "inclining direction" means a direction intersecting with the aligning direction and that includes a perpendicular direction.

In the regions 12A to 12C each of which is a region of recess 12 surrounded by protrusions, approximately entire portion of a constituent side of each of the surrounding protrusions is adjacent to the region 12A in FIG. 1. On the one hand, a part of each of the constituent sides of the surrounding protrusions is adjacent to the regions 12B, 12C in FIG. 15 respectively. For example, as the region 12C shown in FIG. 15(b), the region is surrounded by each of the half of the constituent side of the protrusions. Thus, the density of the protrusions can be preferably increased by forming the recess regions 12B, 12C smaller, surrounded by a part of the constituent sides of the protrusions. It is preferable that the area of the enclosed region of a recess 12 can be formed smaller than the area of the bottom surface of a protrusion, so that a high density of the protrusions and similar reflection of light as in the region 12A can be obtained.

In a relationship between a light emitting element and a recess/protrusion structure, optical output and light extraction efficiency of a light emitting element depend mainly on the height of the protrusion (depth of the recess) and the interval of the protrusions (density of the protrusions). The height of the protrusions (depth of the recesses) may be in a range from 0.2 μm to 2 μm, preferably from 0.5 μm to 1.5 μm. The interval of the protrusions or the width of the recesses may be in a range from 0.5 μm to 1.5 μm, preferably 3 μm or less. Thus, it is preferable that the recesses or protrusions are arranged at high density. Similarly, the width of the protrusions may be in a range from 0.2 μm to 5 μm, preferably 3 μm or less, so as to dispose the protrusion in high density. Not limited to those described above, each of the size described above may be set to $\lambda/4$ or $\lambda/(4n)$ or larger, with respect to the emission wavelength $\lambda$ of the light emitting element so as to provide the protrusions with the highest possible density. Herein, n represents the refractive index of a medium in which light propagates, that is the refractive index of the substrate 10 or the semiconductor 20 that forms an interface with the substrate.

Figure 10:
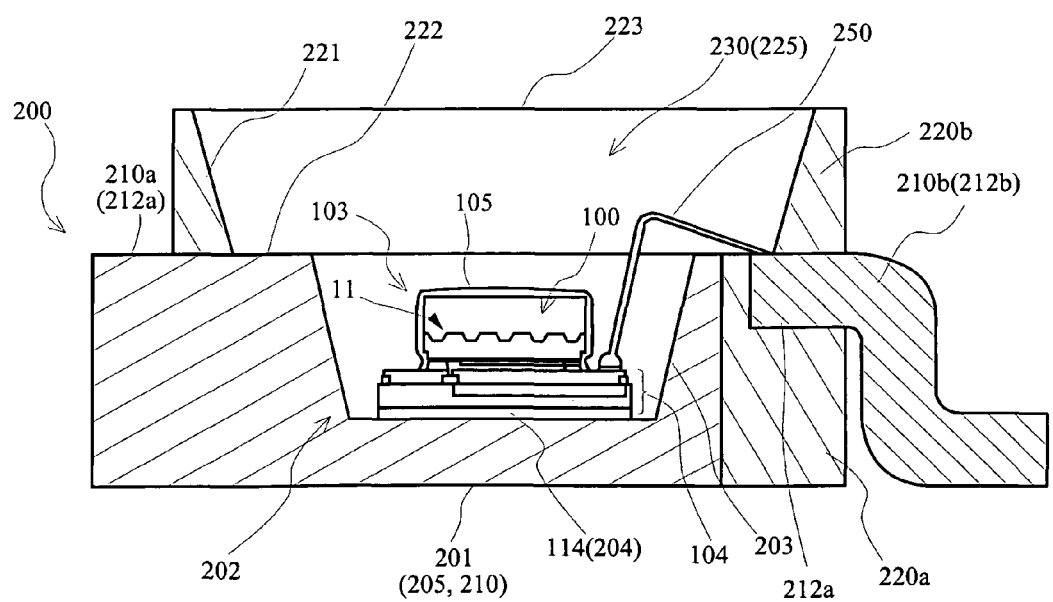
FIG. 10 is a schematic cross sectional view illustrating a light emitting device using a light emitting element according to an embodiment of the present invention.

The shape of the side surface may be, as shown in FIG. 1B and the like, a slope with an acute angle between the bottom surface 14 and the side surface 17 or alternatively, a slope with an obtuse angle thereof. However, it is preferable that when the angle is acute, the exposed surface of the inclined side surface 17 faces toward the semiconductor layer and suitable propagation of light as illustrated in FIG. 10, that is a change from lateral direction to longitudinal direction, can be obtained. Specifically, as shown in FIG. 1B, when the bottom surface 14 of the protrusion is wider than that of the top surface 13, and further, when the area of the bottom surface is larger than that of the top surface, and moreover, when the top surface is provided within the bottom surface in planar view, optical function at the interface between the semiconductor and the side surface 17 of the protrusion portion of the substrate can be improved, and therefore, preferable.

The relationship between the shape of the protrusion 11, especially, the shape of the side surface 17 or the top surface 13 of the protrusion or the bottom surface 14 and the semiconductor light emitting element is preferably, as described above and as shown in FIG. 9, such that the side surface is inclined from the normal line of the top surface of the substrate 13 and/or the bottom surface 14 or the stacked structure of the semiconductor 20. As shown in FIGS. 1 to 3, in the surface of the substrate, the constituent sides 16 of the bottom surface 14 of the protrusions 11, which are facing each other with a recess portion 12 in between, are preferably such that the direction thereof is not being in parallel, but being in a different direction so as to cross each other, preferably in a direction also inclined from the perpendicular direction, because the directional dependency within the plane can be reduced and directional characteristics of emission can be improved compare to the case where the sides are in parallel. Further preferably, as shown in FIG. 1A, the constituent sides 16 of the bottom surface of the protrusions 11, that are the three protrusions 11 in the example shown in FIG. 1A, forming a part of the periphery of a region 12A of a recess 12 are aligned each other in a direction inclined from the perpendicular or parallel directions. Because a further preferable directivity of light tends to be obtained compared to the cases where the sides are arranged in perpendicular or parallel direction.

Herein, although the sides 16 of the bottom surface of the protrusion are illustrated, planar shapes of the top surface and the side surfaces of the protrusion also show a similar tendency. With an approximately circular top surface of the protrusions as shown in FIGS. 1 to 3, the protrusions surrounding a recess 12 are in a configuration in which the protrusions are inclined each other in the parallel or perpendicular direction. As described above, when the top or bottom surface of the protrusion does not include a constitutive side, the above can be applied to the end portions 15 or 16 of the top or bottom surfaces, or to a part thereof. However, as described above, a side is preferably included at least in the bottom surface which has a wider cross section. Because there is a tendency between each portion and the optical properties thereof. That is, the effect on optical properties is larger with the shape of the bottom surface 14 than with the shapes of the side surfaces 17 and the top surface 13, and less with the shape of the top surface 13 than with the shapes of the bottom surface 14 or the side surfaces 17. Especially, the effect thereof becomes more significant when the cross section of bottom surface is larger than that of the top surface, and further, when the bottom surface has a large area. That is, the effect described above becomes significant when the outer circumference of the constituent sides and the end portion 16 of the bottom surface is larger than that of the top surface.

Embodiment 2

Method of Manufacturing Substrate and Element Using the Substrate

A method of manufacturing the above-described substrate and element will be illustrated in Embodiment 2 below and a substrate for light emitting element and an element will be illustrated thereafter.

In a method of manufacturing above-described protrusions shown in FIGS. 1 to 4, as shown in FIG. 7, a mask 19 is formed on the substrate and the protrusions with a top surface, bottom surface and side surface, each having a desired shape described above, are formed by etching the substrate. Examples of etching include wet etching and dry etching that will be described hereinafter. As a dry etching, vapor phase etching, plasma etching, or reactive ion etching may be employed. Examples of the etching gas include, a chlorine-based gas and a fluorine-based gas such as $Cl_2$, $SiCl_4$, $BCl_3$, HBR, $SF_6$, $CHF_3$, $C_4F_8$, $CF_4$ and the like, and an inactive gas such as Ar.

In the cases where dry etching is employed, as shown in FIG. 7B, the shape of the protrusion described above is formed by forming a mask having a three-dimensional shape or by performing the etching at least two times using masks with different shapes. Therefore, compared to that of wet etching, productivity and degree of accuracy of the shape of the protrusions may not be sufficient. Specifically, at least two masks of a lower mask 19a and an upper mask 19b provided thereon are formed with predetermined shapes, in particular, with different shapes, so that the top surface of the protrusion and/or the lower mask 19a are formed with predetermined shapes (FIG. 7B(a)) by using the upper mask 19b. Then, when the substrate is etched through the two masks 19a and 19b, each of the masks is also etched (FIG. 7B(b)) as well as the substrate. By performing further etching, the upper mask 19a is removed and protrusions having top surface, bottom surface, and side surfaces in the predetermined shapes described above are formed (FIG. 7B(c)). Thus in this embodiment, the second mask 19b at the upper side mainly defines the shapes of the first mask 19a at the lower side and/or the top and upper portion of the side surfaces of the protrusions. The first mask 19a at the lower side mainly defines the shapes of the bottom surface of the protrusions and moreover, the shapes of the side surfaces of the protrusions.

To define a mask material, two resist materials, such as a resist film and an inorganic compound such as an oxide or nitride of silicon, aluminum and the like, can be used. When two materials having different exposure sensitivities are used, two layers are coated or formed and then exposed respectively to form predetermined shapes. Herein, the upper layer side can be formed with its predetermined shape after forming the lower layer side with its predetermined shape. Reversely, the upper layer side and lower layer side can be formed in sequence and the upper layer side and lower layer side are processed in sequence to obtain the predetermined shapes. Alternatively, by using the second mask 19b of the upper layer side, the first mask 19a of the lower layer side can be formed with a desired three-dimensional shape.

Figure 7A:
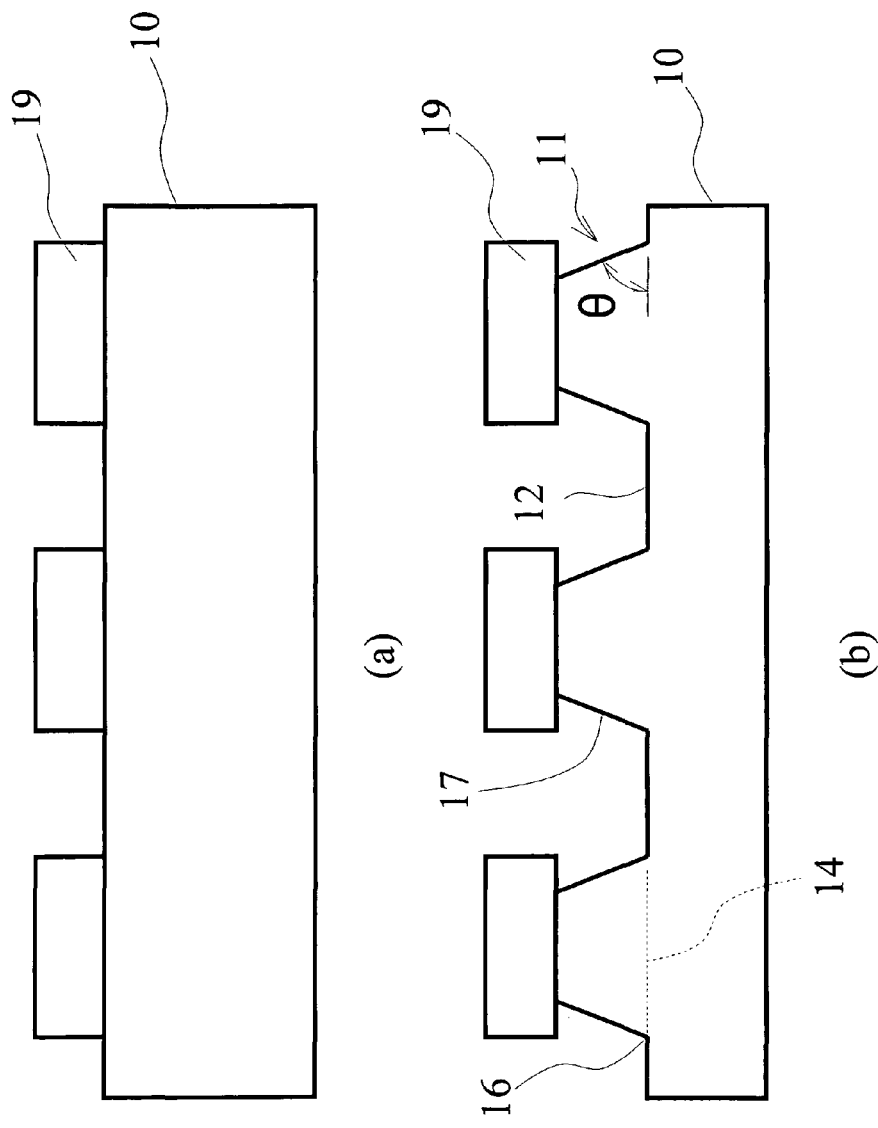
FIGS. 7A(a) and 7A(b) are schematic cross sectional views illustrating a method of manufacturing a substrate according to an embodiment of the present invention.
Figure 7B:
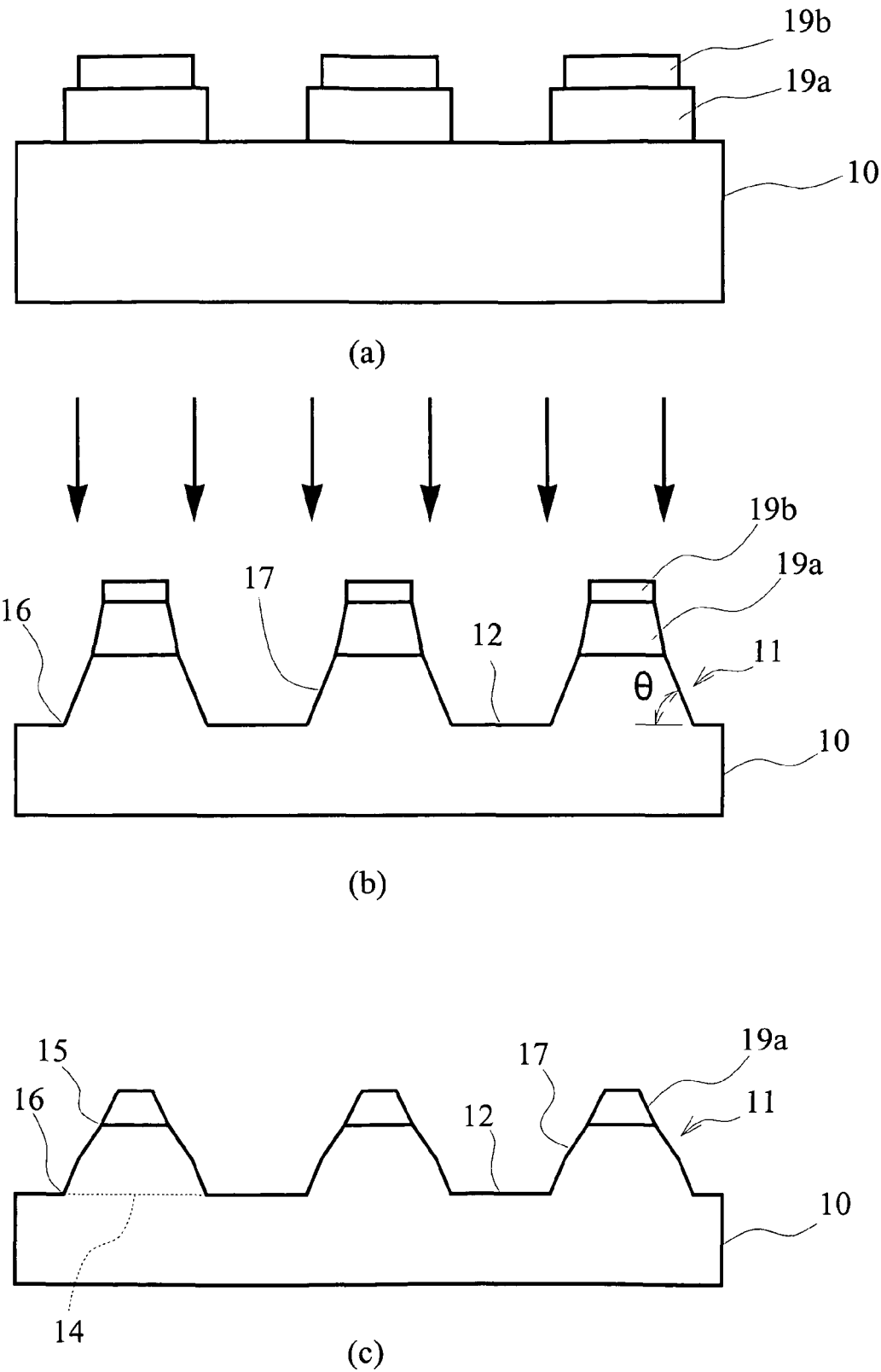
FIGS. 7B(a) through 7B(C) are schematic cross-sectional views illustrating a method of manufacturing a substrate according to an embodiment of the present invention.
Figure 7C:
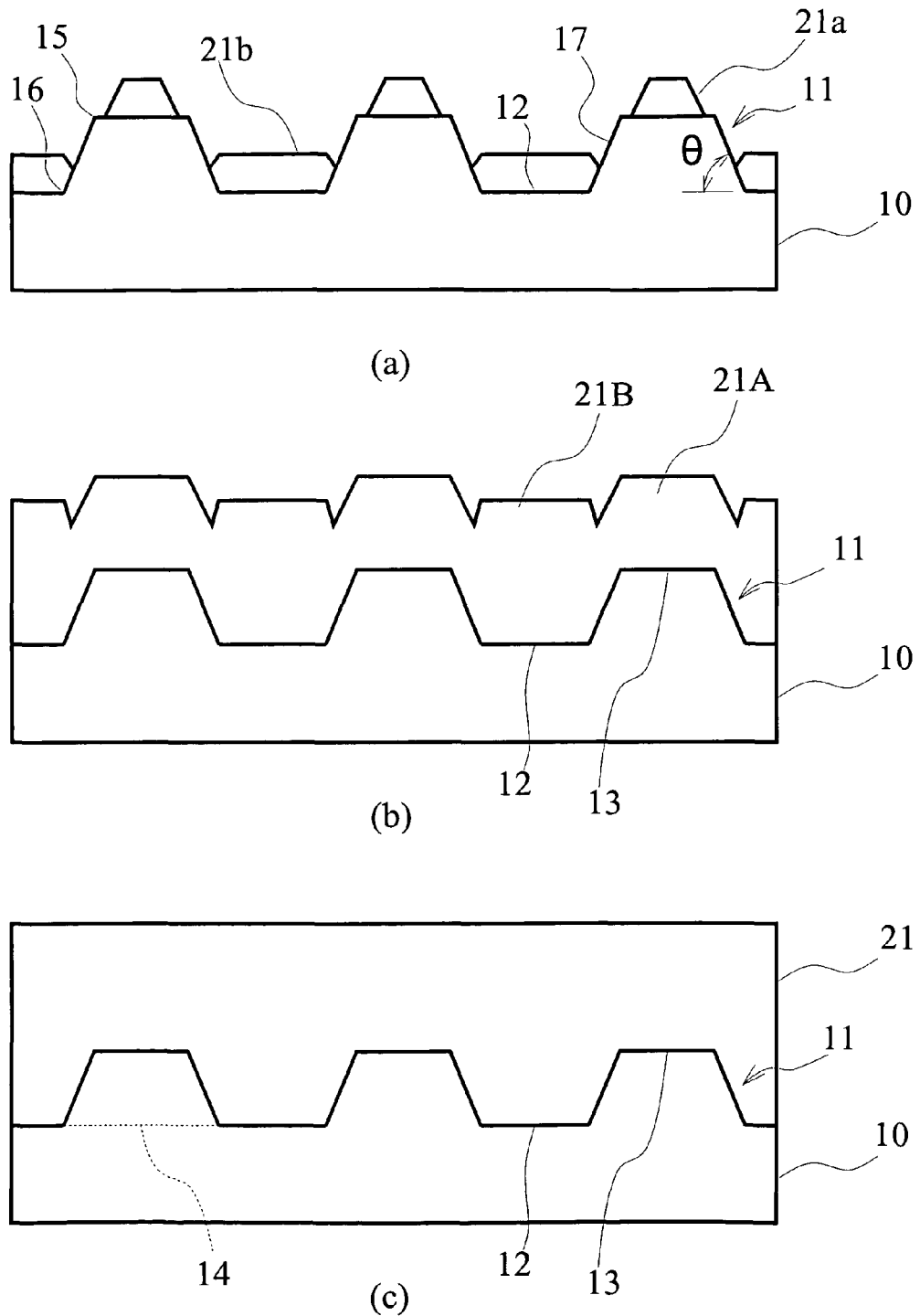
FIGS. 7C(a) and 7C(b) are schematic cross sectional views illustrating a method of growing a semiconductor in manufacturing a semiconductor substrate according to an embodiment of the present invention.

Herein, FIGS. 7A(a), 7A(b) and FIGS. 7B(a) to 7B(c) are schematic cross-sectional views respectively showing an example of a method of manufacturing a substrate of the invention, and FIGS. 7C(a) to 7C(c) are schematic cross-sectional views showing an example of a method of manufacturing an element by growing a semiconductor on the substrate. FIGS. 8(a) and 8(b) are schematic plan views showing a substrate having a recess/protrusion structure and illustrating a growth of a semiconductor on the surface thereof. In the following, a manufacturing method thereof according to the invention will be described with reference to the figures.

Referring to FIGS. 7A(a) to 7C(c), a basic embodiment of a process of forming the protrusions 11 of a substrate by using the above-described etching will be described below. A protective film 19, which is to be an etching mask, is disposed and defined into a predetermined shape on a substrate 10, as shown in FIG. 7A(a). A substrate capable of growing a semiconductor thereon, such as a sapphire substrate in an example, is used for the substrate 10. The protective film 19 may be formed with a pattern corresponding to approximately the same shape as the shape of the top surface 13 of the protrusions in a planar configuration such as a circular shape shown in FIGS. 1 and 3, to form a mask 19.

Next, as respectively shown in FIGS. 7A(b) and 7B(b), the protective film 19 and the exposed surface of a substrate 10 are etched. Either dry etching or wet etching described above can be used for the etching, and wet etching is preferably used. This is because when wet etching is used, the surface of the protrusions can be made smoother which contributes to improve crystallinity and with good mass productivity. Moreover, the shape of the bottom surface of the protrusions and further the shape of the top surface thereof can be formed easily with a shape that is an intermediate shape between the crystal shape of the substrate and the shape of the mask as described above. As the etching solution in wet etching, for example, for a sapphire substrate shown in the example, phosphoric acid or pyrophosphoric acid, a mixed acid of phosphoric or pyrophosphoric acid with additional sulfuric acid, or solution of potassium hydroxide can be used. As the etching solution, various etchants can be used as the etching solution according to each material of the substrate, and typically, a high temperature etching solution such as hot phosphoric acid is used as shown in the embodiment. Other than an oxide of silicon such as $SiO_2$ shown in the embodiment, the mask material is suitably selected according to the substrate material and the etching solution. The examples of such material include an oxide of at least one element selected from the group consisting of V, Zr, Nb, Hf, Ti, Ta, Al, and a nitride of at least one element selected from the group consisting of Si, B, and Al.

Next, specific examples of forming the protrusions by way of wet etching will be described below.

As shown in FIGS. 7A(a) and 7A(b), the mask 19 is formed with a predetermined shape and a periodic or regular structure, and then wet etching is performed. Accordingly, as shown in FIG. 7A(b), as the etching progress, the protrusions are formed under the mask, with a shape according to the present invention. Thus, the protrusions each having a top surface smaller in width and area than that of the mask can be obtained. Typically, a surface and a shape that depend on the planar orientation of the substrate crystal are formed by wet etching. However, by controlling the planar shape of the mask and the amount of etching, the protrusions, especially the bottom surface and the side surfaces thereof, can be formed with above-described shapes of the present invention. The shape of the top surface of the protrusions mainly depends on the mask shape as described above, so that the top surface can be formed with a similar shape as the mask shape, specifically, approximately homothetic to the mask shape.

Generally, etching of a C-plane sapphire substrate results in a triangular pyramid shape having a triangular bottom surface. Therefore, as shown in FIGS. 1 to 3, in a case where the protrusions are formed with a circular top surfaces and an approximately triangular bottom surfaces (in which each side of a bottom surface includes two sides 16-1, 16-2 and two side surfaces 17-1, 17-2), by using a circular mask, a circular top surfaces which are similar shape as the mask are formed, and an approximately triangular bottom surfaces (each having six constituent sides in total) which are analogous form as a triangular shape of the crystal, are formed. In an example shown in FIG. 4, etching is performed by using a mask having approximately regular triangular shape that is rotated 180° in relation to the approximately triangular shape 14b of the etching surface. Thus, the protrusions can be made in a composite shape made up of the top surface shape which depends on the mask shape and the bottom surface shape which depends on the etching properties of the substrate, such as a composite shape made up of the crystal shape of the substrate and the mask shape. That is, a composite shape made up with the constituent sides 14 of the bottom surface, the side surfaces 17-2 depending on the top surface shape, and the side surfaces 17-1 and 17-3 (providing the constituent sides 16-1a, 16-2a) depending on the etching properties can be obtained. As described above, the shape of the protrusion portions of the substrate according to the present invention can be made with the shapes and the number of the constituent sides different in the top surface and the bottom surface, by utilizing the etching properties.

In addition, when the amount of wet etching is further increased in an example shown in FIG. 7A, the cross-sectional width and the area of the top surface can further be reduced. Therefore, a shape having little or no top surface such as a pyramid, a hemisphere or semicircular shape, and an acuminate or curved shape can be made. As will be hereinafter described, a suitable crystal growth of a semiconductor can be obtained when the growth of the semiconductor occurs from the top surface, compared with the case in which a growth from the top surface did not occur. That is, with the growth from the top surface, formation of voids due to uneven surface, deterioration of crystallinity, and decrease in the effect of lowering the crystal transition can be prevented.

A method of growing a semiconductor on a substrate surface by using a substrate provided with the protrusions described above, and forming a semiconductor substrate will be described below. Although the shape of the protrusions of the substrate is similar to that described in Embodiment 1, the planar orientation thereof becomes important. Because, a crystal growth on a substrate depends on the epitaxial growth of the semiconductor crystal. Therefore, it is important to adjust the shape, periodic or regular structure, and the orientation appropriate for the crystal growth.

For example, when the substrate 10 is a C-plane sapphire substrate and the semiconductor 21 is GaN grown in the c-axial direction, the GaN crystal typically grows with a planar orientation rotated 30° around the c-axis in relation to the planar orientation of the sapphire substrate. Accordingly, the shape of the protrusions 11, especially the bottom surface thereof, is preferably formed in a polygon as described below. That is, the planar shape of the protrusions 11 is made to be a polygon having the sides approximately in parallel with the A-planes of GaN (1 1 −2 0), (1 −2 1 0), and (−2 1 1 0), and having vertexes in the stable growth surfaces of GaN (1 −1 0 0), (0 1 −1 0), and (−1 0 1 0). The polygon is based on a polygon formed with the sides in the stable growth planes (1 −1 0 0), (0 1 −1 0), and (−1 0 1 0). In other words, the polygon does not have any sides in parallel with the M-plane and formed with the sides that are in the directions intersecting to the M-plane. When the protrusions 11 are formed in such shapes, a GaN that is flat and having excellent crystallinity can be grown. In FIGS. 1 to 3, the direction of A-axis of the substrate (a direction within the substrate surface that is perpendicular to A-plane) is indicated by arrows A. Specifically, when the planar shape of the protrusions is an approximately regular triangle, the sides of the regular triangle of the protrusions 11 are preferably formed so as to intersect with the M-plane that is a stable growth plane of GaN in a view from above the substrate.

This is thought that, as shown in FIGS. 7C(a) and 7C(b), the growth speed of GaN is higher at the joining portion between the GaN grown from the top surface of the protrusions 11 and the GaN grown from the flat surface (recesses 12) where a protrusion 11 is not formed. That is, from the top surface of protrusions 11, GaN crystal 21a is grown in a hexagonal shape with the sides along A-axis as shown in FIGS. 8(a) and 8(b). Here, the growth speed of GaN increases at the joining portions in the vicinity of the side surfaces of the protrusions between GaN crystal 21a grown from the top surfaces 13 of the protrusions 11 and GaN crystal 21b grown from the flat surfaces 12. Therefore, the growth of GaN in the vicinity of the side surfaces of the protrusions 11 catch up with the other portions, so that GaN with flat surface can be obtained.

Figure 8:
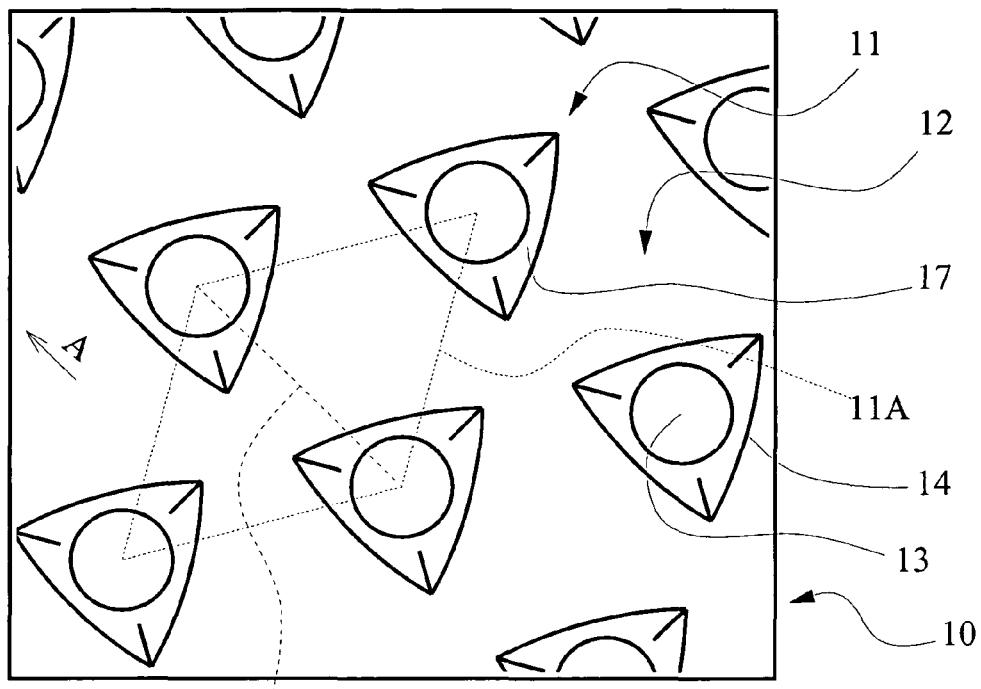
FIG. 8 is a schematic plan view illustrating a growth method of a semiconductor on a substrate of an element according to an embodiment of the present invention.
Figure 8:
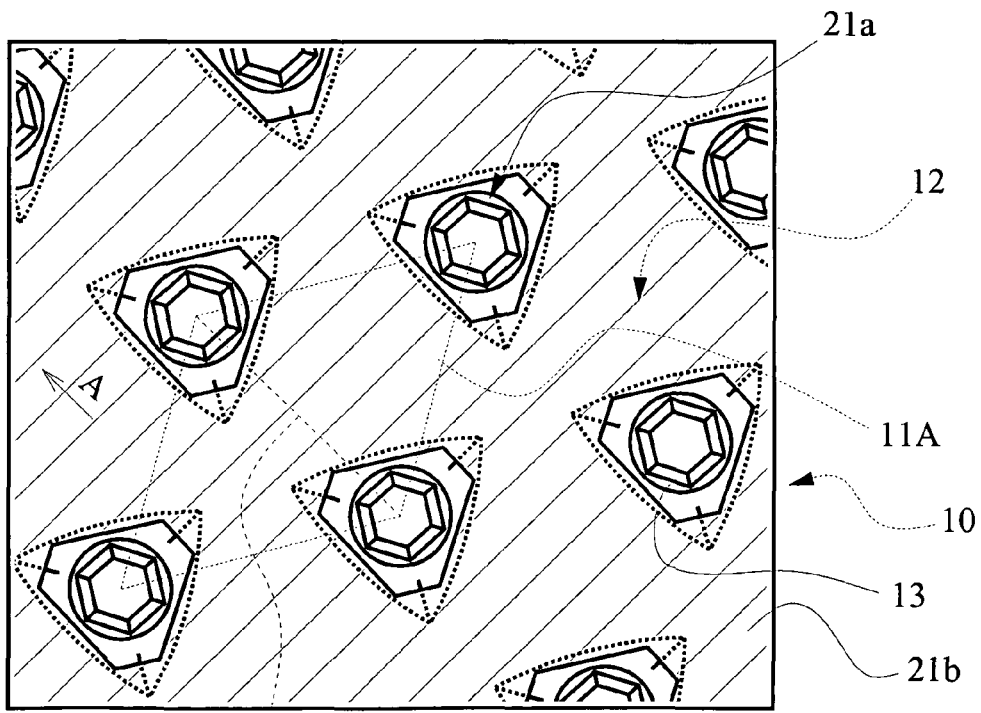

The protrusions to the substrate for growing semiconductor may be formed in the shapes as typically shown in FIGS. 1 to 3. For example, as shown in FIGS. 7C and 8, in the early stage of crystal growth, the crystal portions 21a growing on the top surface of the protrusions and the crystal portions 21b growing on the surface of the recesses are separately grown (FIG. 7C(a), FIG. 8(b)). Then, each of the crystal portions 21a and 21b further grow and overlap each other at least partially at their side surfaces to form crystals 21A and 21B (FIG. 7C(b). Thereafter, uneven portion of each of the crystal portions 21A and 21B are smoothed to form a semiconductor layer 21. As described above, it is preferable to grow the crystal so that the recesses are filled with the crystal to prevent void formation, and that results in improvement of the optical properties in the above-described embodiments. In this example, there is little growth at the side surfaces 17 of the protrusions. However, crystal growth from the side surfaces may be possible by adjusting factors such as the substrate material, the shape of the protrusion portion, the semiconductor material, and planar orientation of each crystal.

As described above, in order to fill the recesses more suitably with the growth of the crystal, the angle of inclination θ of the side surfaces of the protrusions is preferably set corresponding to the interval, density, and height of the protrusions, for example to values in the vicinity of 45°, more specifically, in a range between 20° and 70°, further preferably in a range between 30° and 60°. The protrusions and the interval thereof may be set as that in the above embodiments. Because a suitable growth of crystal become difficult when the interval or the size of the protrusions is smaller, or the height of the protrusions is larger. However, with the dimensions described above, a suitable growth can be obtained.

With the growth of a semiconductor layer using the substrate of the present invention, the crystallinity of the semiconductor layer can be improved. Specifically, crystallinity may be decreased when a semiconductor crystal is grown on a foreign substrate due to the differences in the properties such as lattice constant and the thermal expansion coefficient, the crystal structure, and the planar orientation. However, according to the present invention, such disadvantages can be suppressed, or further, penetrating dislocations can be reduced. This is because as described above, each of the semiconductor crystal portions 21a and 21b grows three-dimensionally, in particular, by a facet grow. Propagation of the dislocations and the like, occurred at the interface with the substrate can be suppressed in growing the crystal, by the lateral growth or overlapping of the crystals at the side surfaces or in the lateral direction.

Herein, as shown in FIGS. 1 to 4, with respect to the constituent sides of the bottom surfaces 14 of the protrusions, the sides 16-1, 16-2 constructing each of the side, and the side surfaces 17-1 to 17-3, the constituent segments of a side 14-1 and 14-2 either form a larger angle than that of the corners of the bottom surfaces 14 of the protrusions or an obtuse angle. Preferably. Each of the sides of the shapes 14a of the bottom surfaces 14 of the protrusions preferably includes the both. Because, when each of the sides is formed with the constituent segments connecting with an obtuse angle or a large angle, the magnitude of the effect of crystal growth, that is, a dependence on planar orientation with the semiconductor crystal described above can be decreased. At the same time, an appropriate crystal growth and filling of the recesses tend to be obtained when a side is formed with a plurality of constituent segments. When each side of the shapes 14a of the bottom surfaces 14 is connected to a plurality of side surfaces 17-1 to 17-3, at least a part of the sides are formed with the constituent segments (FIG. 4), and preferably, only the side surfaces corresponding to the constituent segments (FIGS. 1 to 3) are included. Because, as similar to that in the constituent segments described above, a dependence on planar orientation with the semiconductor crystal described above tends to be decreased, so that a suitable crystal growth can be obtained. As described above, the growth of a semiconductor crystal tends to depend on the shape of the bottom surface rather than that of the top surface, and specifically the tendency is significant when the bottom surface is wide. Accordingly, it is preferable to form the bottom surfaces as described above. On the other hand, when the top surfaces have a shape similar to the shape shown in FIG. 4, dependency on the shape of the top surface in the crystal growth increases and it tends to reduce the crystallinity. However, it can be suppressed by forming the complex side surfaces 17-1 to 17-3 as described above. More specifically, as shown in FIGS. 1 to 4, the sides of the bottom circumference are formed to outwardly protrude from the bottom surface shape 14a, with the constituent sides 14-1, 14-2 and the side surfaces 17-1 to 17-3 connecting to each side. Thus, the protrusions can be made with a polygonal shape having a large number of sides, with a rounded shape of the polygon, and further, with an approximately circular shape. Thus, it is preferable because an appropriate crystal growth, specifically of the crystal 21b from the recess portion 12 can be obtained.

Figure 5:
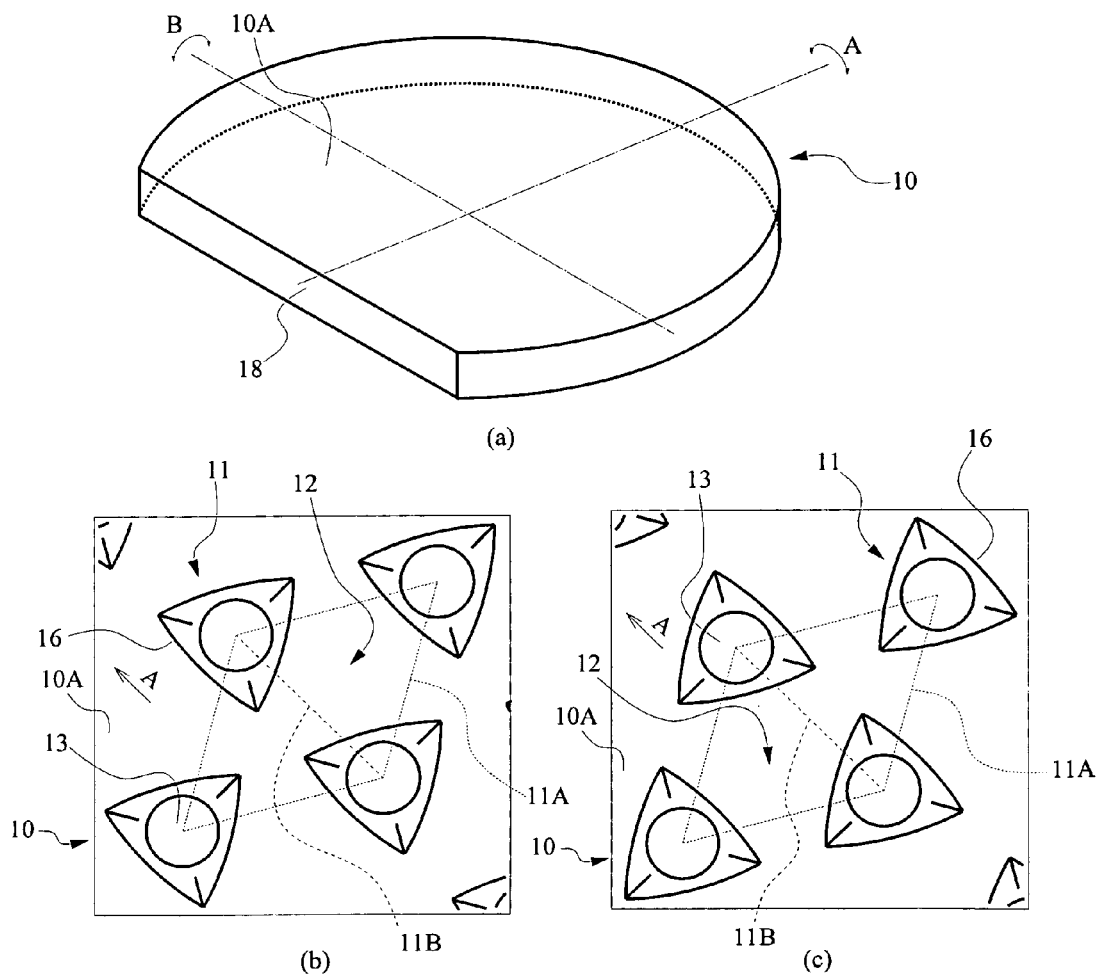
FIG. 5(*a*) is a schematic perspective view illustrating a substrate and FIG. 5(*b*) and FIG. 5(*c*) are schematic plan views each illustrating a configuration of recess/protrusion of a substrate according to an embodiment of the present invention.

FIGS. 5(a) to 5(c) illustrate a first main surface 10A of a substrate 10 and its inclination or off-angle, and a difference in the configuration and periodic structure of the protrusions formed accordingly. FIG. 5(a) is a schematic perspective view illustrating an inclination of a substrate, FIGS. 5(b), 5(c) are plan views respectively illustrating a configuration of the protrusions due to the inclination of the main surface 10A of the substrate. Specifically, FIGS. 5(b) and 5(c) are views showing two exemplary configurations which are dependant on the off-angles and are obtained by applying wet etching on a C-plane sapphire substrate, as shown in Example 1.

The inclination of the substrate main surface 10A may be defined in two directions as shown in the figure. An inclination relative to the axis of rotation in the direction of the normal line of the orientation flat plane 18 (A in the figure), and an inclination relative to the axis of rotation in the direction perpendicular to the normal line of the first main surface (B in the figure). For instance, in Example 1 to be described later where the first main surface 10A is off-angled with respect to the C-plane as the main surface and the orientation flat surface 18 as the A-plane, two configurations (FIGS. 5(a) and 5(b)) may be provided with respect to the direction of the triangular shapes 14a on the bottom surface in the shape of the protrusions shown in Example 1, corresponding to the inclination in the rotational direction of the A-axis (B in the figure). On the other hand, the degree of inclination angle is set lower with respect to another axis in the example. Therefore, a difference in the configurations is not apparent.

Thus, in the case where different configurations of the protrusions 11 (the top surfaces 13 and the bottom surfaces 14 thereof) may be provided to the substrate corresponding to the off-angle of the main surface, the shape of the protrusions is preferably formed according to the present invention as described above. In the case where the off-angle is fluctuate depending on the substrate, or where the off-angle is fluctuate within the substrate surface, problems arose in the semiconductor layer growth due to the difference in the shapes of the protrusions, in controlling the growth, and eventually in the mass productivity. However, such disadvantages can be solved according to the present invention. Variation in off-angle in the substrate surface will result in occurrence of regions having different configurations in the shapes, direction, and periodic structure of the protrusions within the substrate surface. In the above-described example, two regions having different configurations are formed. In this example, the degree of off-angle in the configuration shown in FIG. 5(b) is greater than 0, in specific, in a range from 0.050 to 0.25°, and that shown in FIG. 5(c) is smaller than 0, in specific, in a range from −0.05° to −0.25°.

In the above-described example, each angle is set in a range of relatively low angles, specifically from +0.50 to −0.50. It is thought that if each angle is in a higher range, dependency arises corresponding to each angle of inclination and their compound angles.

Other structures and members in each embodiment illustrated above will be described below.

(Substrate)

In the present invention, a light transmitting substrate is used for a light emitting element employing a nitride semiconductor. Specific examples include an insulating substrate of sapphire substrate or spinel substrate, and an electrically conductive substrate such as SiC substrate and GaN substrate. It is preferable to use a light transmitting substrate having a large difference in the index of refraction with respect to that of the semiconductor material. More specifically, for example, a sapphire substrate having a C-plane (0001) as a main surface can be used as the above-described substrate. The stable growth plane of a GaN-based semiconductor layer is an M-plane {0 –1 0 0} of a hexagonal crystal. Here, "–1" in Miller index indicates "1" with a bar on top. In this specification, Miller index will be shown in the same manner. Here, {1 –1 0 0} represents (–1 1 0 0), (0 1 –1 0), (–1 0 1 0) and the like. In a c-axis oriented GaN-based semiconductor crystal, an M-plane is one of the planes parallel to the A-axis within the substrate surface. Other planes that include the A-axis of GaN semiconductor in the substrate surface, namely planes other than the M-plane, such as the facet of {1 –1 0 1} plane may also become the stable growth plane, depending on the growing condition. In the case of a C-plane sapphire substrate, the M-plane that is the stable growth plane of the GaN-based semiconductor layer is the plane parallel to A-plane {1 1 –2 0} of the sapphire substrate. The A-plane {1 1 –2 0} represents (1 1 –2 0), (1 –2 1 0), (–2 1 1 0) and the like.

A substrate used for a semiconductor element other than a light emitting element is needed to be not only light transmissive but to allow suitable growth of semiconductor. For example, by using a foreign substrate such as Si substrate for a nitride semiconductor and the recess or protrusion structures according to the present invention, a semiconductor element excellent in crystallinity can be obtained.

(Light Emitting Element)

In the structure of the light emitting element, a semiconductor structure 20, specifically a layered structure 20 having each of the semiconductor layers stacked is provided on a substrate as shown in FIGS. 6, 9 and the like. A structure without having a substrate, which is obtained by removing the substrate and the like, a structure without having a semiconductor layer such as an underlayer 21 other than active region of the element, an element region or structure provided with a conductive region in the substrate, may also be employed. In the light emitting structure, a light emitting region of the semiconductor structure 20, and further, a first and second electrodes 30, 40 on the same surface side are provided, as illustrated in an example shown in FIG. 6, in which a first and second conductive-type layers 22, 24 and an active layer 23 therebetween are provided. With this electrode structure, a first electrode 30 or an exposed region 22s of a first conductive-type layer, and a region of light emitting structure are at least arranged in the element region within the substrate surface. The light emitting structure preferably has such active layer or light emitting layer between the first and second conductive type layers. Also, a structure having a p-n junction as the light emitting part, a light emitting structure having a p-i-n structure, a MIS structure and the like may be employed. In addition, a semi-insulating or insulating portion, an i-type layer, or a reverse conductivity type layer or region may be provided to a part of element structure or each conductive type layer. For example, a current blocking layer or region formed with such as a semi-insulating or insulating portion, or an i-type layer, a reverse tunneling layer formed with a reverse conductive type for contacting with an electrode, may be provided to the structure.

(Electrode)

In the light emitting element structure in which the first and second electrodes are provided on the substrate and the electrode forming side is the main emitting side, the first layer of the first electrode 30 and the contact layer 41 of the second electrode are formed as light transmissive films. Examples of the light transmissive conductive film and a p-side electrode of a nitride semiconductor include at least one metal selected from the group consisting of Ni, Pt, Pd, Rh, Ru, Os, Ir, Co, Ag, an alloy and a layered structure thereof, and further, a compound thereof such as a conductive oxide or nitride. Examples of a conductive metal oxide (oxide semiconductor) used for the first and second electrodes include indium oxide doped with tin (Indium Tin Oxide; ITO) having a thickness of between 5 nm to 10 μm, ZnO (zinc oxide), $In_2O_3$ (indium oxide), and $SnO_2$ (tin oxide), a compound thereof such as IZO (Indium Zinc Oxide). Such materials are preferably used because of their advantage in light transmissive properties, and a suitable material is selected according to the wavelength of light. In addition, constituent element of the semiconductor, dopant of the semiconductor, and the like can also be used for a doping material for the conductive materials described above.

(Light Emitting Structure and Electrode Structure)

The light emitting structure is selected suitably according to the area and properties of the element. That is, a single light emitting structure may be provided in a light emitting element region as shown in FIG. 6, or a region such as an exposed region 22a of the first conductive type or a first electrode forming region may be interposed in a part of a light emitting structure. The light emitting structure and the first electrode 30 are not needed to be one-one relation and other relations such as two-one relation as in the structure where the light emitting structure is arranged between the first electrodes 30 may be employed, as long as the structure includes at least a set of a light emitting part and a first electrode 30 provided correspondingly thereto. As described above, when the main surface of the electrode forming side of the substrate is the light extracting side, a light transmissive electrode is used. As shown in FIG. 10, when the main surface of opposite side of the semiconductor that is the back surface side of the substrate is light extracting side, a reflective electrode is used. In addition to this, a structure may be employed in which each of the opposite main surfaces of the semiconductor is provided with an electrode.

A nitride gallium-based compound semiconductor material for a light emitting element or a semiconductor grown on a substrate is preferably represented by a general formula $In_xAl_yGa_{1-x-y}N$ (wherein $0 \leq x \leq 1$, $0 \leq y \leq 1$, and $0 \leq x+y \leq 1$), and as described later, a binary mixed crystal or ternary mixed crystal thereof can be suitably used. Other than a nitride semiconductor, the above can also be applied to other semiconductor materials such as GaAs- or GaP-based compound semiconductor and AlGaAs- or InAlGaP-based compound semiconductor.

(Protrusion, Optical Structure Portion)

Figure 11:
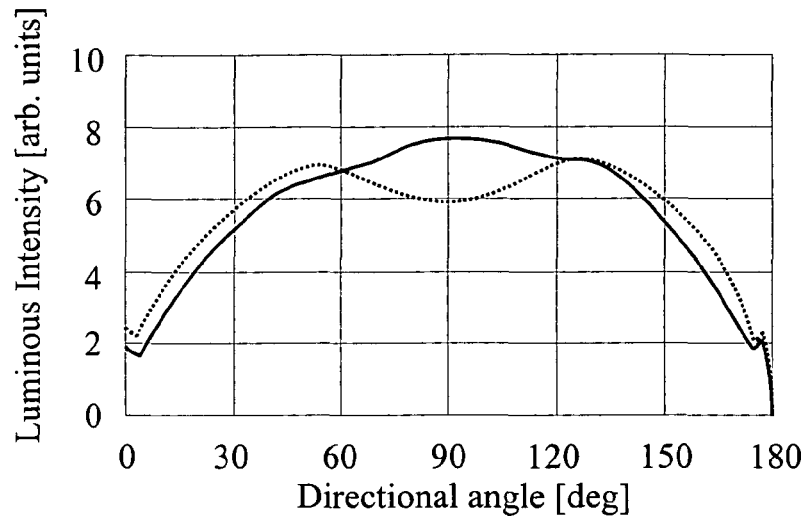
FIGS. 11(*a*) and 11(*b*) are graphs showing radiation properties in a direction along line A-A (FIG. 11(*a*)) and along line B-B (FIG. 11(B)), of the light emitting element (FIG. 11 (*c*) according to Example 3 (shown in solid lines) and Comparative Example 1 (shown in dotted lines) according to the present invention.
Figure 11:
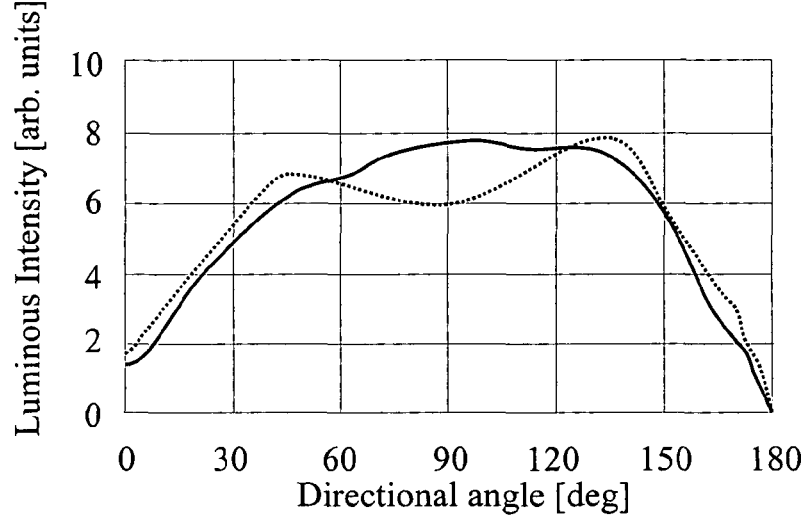
Figure 11:
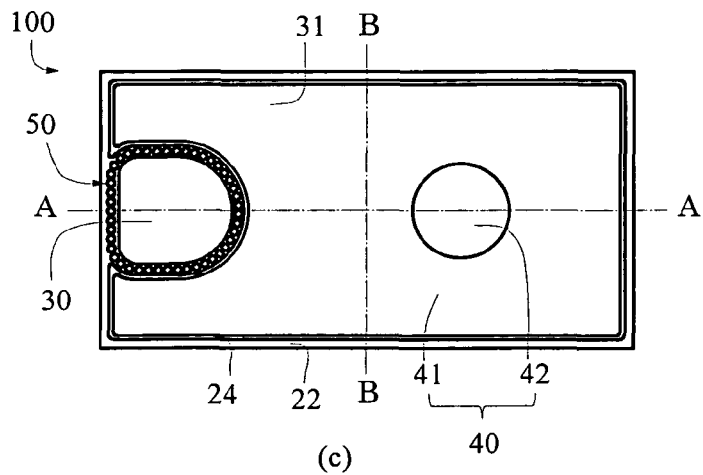

A structure such as protrusions having optical functions such as reflection, dispersion, diffraction, and emitting aperture may be provided to a semiconductor staked structure, for example, to an exposed surface of the first conductive type semiconductor layer between the electrode 30 and light emitting structure. A similar effect can be obtained by providing a recess/protrusion structure to the semiconductor structure portion in a similar way as the above-described recess/protrusion structure of the substrate (FIG. 10). Such optical structure is preferably formed with a light transmissive insulating material with reduced light absorption and loss such as a recess/protrusion structure provided by a protective film on the exposed surface 22s of the first conductive type semiconductor layer. Insofar as the functions of reflection and dispersion, a metallic protrusion portion or recess/protrusion portion can be provided thereon. Because the region between the electrode and light emitting structure is narrow, providing a semiconductor structure, for example, the recess/protrusion 50 portion as shown in FIG. 11(c), divided from the layered structure of the semiconductor, specifically from the light emitting structure, is preferable than providing an additional structure. With this arrangement, the optical structure can be formed with high accuracy and high density so that the optical function thereof can be improved. Further, it is preferable because a light transmissive material similar to that of the light emitting element is used for the structure.

A known material having appropriate light transmissive properties, such as an oxide or nitride of silicon and an oxide of aluminum, may be preferably used for a protective film provided at the sides of the surface of the semiconductor layer 20 and the electrode surface of the light emitting element, according to light and wavelength of the light emitting element. The thickness of the film may be about 0.1 to 3 µm, and preferably about 0.2 to 0.6 µm.

Such recess/protrusion structure 50 may be formed with separated protrusions, for example, an approximately circular in planar shape, by providing a separating groove from the light emitting structure of the semiconductor structure. On the other hand, a complex structure may be formed in which an opening (recess) is formed in the light emitting structure. A planar shape of such protrusion or recess is most preferably circular which allows an arrangement of high density with good mass productivity, but shapes such as elliptic, square or rectangular, polygonal, and a complex shape thereof may also be employed. A configuration such as square or rectangular, parallelogram, triangular, hexagonal or honeycomb lattice is suitably selected to obtain a high density configuration, according to the planar shape described above. When the planar shape of these structural components such as a protrusion, recess, and groove has a width of 0.5 to 5 µm, preferably 1 to 3 µm, preferable production can be performed. In addition, the cross-sectional shape thereof may be such as trapezoidal or inverted trapezoidal, rectangular, preferably with a wider bottom surface and top surface being inclined toward the electrode as in a similar way as the above-described protrusions of the substrate. As described above, a protrusion in the present specification is a structural component having an optical properties to provide an optical function at a surface, top surface, or side surface of the semiconductor 20 or at an interface with other materials.

(Light Emitting Device)

Next, a light emitting device 200 having the above-described light emitting element 100 mounted will be described. As shown in FIG. 10, the light emitting element 100 is mounted on a mounting portion 202 (an opening portion in the light emitting portion 223 in the figure) defined in a region 201 of the substrate of the light emitting device. Examples of the mounting substrate include a stem 210 for a light emitting element, a ceramic substrate for surface mounting, and a plastic substrate. Specifically, a mounting substrate made of AlN or a substrate made of a metal is preferably used, because a light emitting device having high heat dissipation can be obtained. The mounting surface where the semiconductor light emitting element to be mounted is made of a metallic material so that the light extracted from the light emitting device is reflected from the mounting surface and a light emitting device having suitable directivity of light can be obtained. At an inner surface of the device where the emitted light reaches, such as a mounting surface having the light emitting element mounted thereon and the reflecting surface 203, a metallic material is used for a lead electrode 210 and the like. The metallic material is preferably capable of effectively reflecting light of a wavelength emitted from the light emitting device of the present invention. Examples of the metallic material include such as Ag, Al and Rh, and a plated film or the like may be formed. In an example of the light emitting device, as shown in FIG. 10, the electrode side of the light emitting element 100 is bonded to the mounting substrate 104, which is also a protective element against static electricity, by using an adhesive. The mounting substrate 104 side of the layered structure 103 of the light emitting element 100 is bonded to the mounting portion 202 of the light emitting device via an adhesion layer 114. In other cases, the electrode side of the light emitting element 100 is designated as the emission side, and a semiconductor light emitting element 100, whose second main surface of the substrate is provided with a metallization layer, and an eutectic solder and an adhesion layer, may be mounted on a element mounting portion of a base substrate or a package 220 of a device by way of thermocompression or the like. The protective element may be mounted on and electrically connected to a mounting portion 222 provided outside of the recess 202 of the base material of the device.

Each electrode of the light emitting element is connected to respective lead electrode 210 of the light emitting device 200 by such as a mounting substrate 104 and a wire 250, and the light emitting element is enclosed with a light transmissive sealing member 230. A transparent resin, glass and the like having excellent weather-resistance such as an epoxy resin, a silicone resin, and a fluorocarbon resin may be used as a sealing member. A material such as a solder such as a eutectic solder, a eutectic material, and an Ag paste may be used as the adhesion member other than such resin materials. In the example shown in the figure, a reflective electrode is used as an electrode of the light emitting element.

Various emission colors can be obtained by providing a light converting member, which is capable of converting at least a part of light from the light emitting element, in the sealing member 230 or the like, which is provided on a light path between the light emitting element and the light outputting portion such as the emission portion 223 in FIG. 10 of the light emitting device 200. Examples of the light converting member include a YAG fluorescent material which is suitably used for white light emission by combining a blue LED, a nitride fluorescent material converting light in near-ultraviolet to visible light to light in yellow to red region, or the like. Especially, for a high luminance, longtime operation, a fluorescent material having a garnet structure such as TAG and TAG, for example, $(Re_{1-x}Sm_x)_3(Al_{1-y}Ga_y)_5O_{12}:Ce$ ($0 \leq x \leq 1$, $0 \leq y \leq 1$, where Re represents at least one element selected from the group consisting of Y, Gd, La and Tb) and the like are preferably used. Examples of the nitride-based fluorescent material and the oxynitride-based fluorescent material include Sr—Ca—Si—N:Eu, Ca—Si—N:Eu, Sr—Si—N:Eu, Sr—Ca—Si—O—N:Eu, Ca—Si—O—N:Eu, Sr—Si—O—N:Eu or the like, and represented by a general formula $L_xSi_yN_{(2/3X+4/3Y)}:Eu$ or $L_xSi_yO_zN_{(2/3X+4/3Y-2/3Z)}:Eu$ (where L is one selected from among Sr, Ca, Sr, and Ca). A light emitting device having desired emission color can be obtained by suitably using the fluorescent material described above or other fluorescent materials. In the example shown in the figure, a coating member 105 including a light converting member is provided around the element 100.

EXAMPLES

Now examples of the present invention will be described below, but the present invention is not limited to these examples and may be applied to various other forms on the basis of the technical idea of the present invention.

Example 1

A sapphire substrate having a principal plane in C-plane (0 0 0 1) and an orientation flat surface in A-plane (1 –1 2 0) is used. First, a $SiO_2$ film 19 that makes an etching mask is formed on the sapphire substrate 10, as shown in FIG. 7A(a). Then, using a photomask, masks 19 each having circular shape of about 2 μm in diameter are arranged periodically.

Then, as shown in FIG. 7A(b), the substrate is immersed in an etching bath containing a mixed acid of phosphoric acid and sulfuric acid as etchant at about 290° C. for about 5 minutes to obtain a depth (height of protrusions) of about 1.1 μm.

The structure of a protrusion thus obtained on the substrate may have a structure, as shown in FIG. 1A, in which a side of a triangle of the bottom surface 14 is about 3 μm and each of the two sides 16-1, 16-2 forming a constituent side 16 thereof shown in FIG. 2 is about 1.5 μm. Such protrusions are arranged periodically with intervals of the protrusions 11 of about 3 μm, that is the distance between the ends of the top surfaces 15, in a basic pattern 11A with a parallelogram, shown in dotted lines, having inner angles of about 60° and 120° (shown in solid lines in FIG. 1A). The constituent sides 16 of the protrusions surrounding the region 12A in FIG. 1A, that is a constituent side 16 of each of the adjacent protrusions 11, are disposed at an angle with each other inclined from parallel or perpendicular direction, to form a basic unit 11A. The basic unit 11A are aligned periodically at a regular interval along the axis directions 11a, 11b. Here, each of the constitutive sides of the triangle 14a of the bottom surface of the protrusions is formed approximately in parallel with the M-plane of the substrate as shown in FIGS. 1 and 3. Further, each constitutive side 14a is formed by corresponding two sides 16-1 and 16-2 as shown in FIG. 2, and the constitutive sides 16-1 and 16-2 are formed approximately in parallel with the R-plane of the substrate.

Then, the substrate is loaded into a MOCVD apparatus, in which a GaN buffer layer of about 20 nm is grown at a low temperature on a first main surface where the above-described protrusion portion is provided, and thereon, a GaN of about 2 μm is grown in the c-axis at a high temperature (about 1050° C.) to form an underlayer 21. The growth of the underlayer 21 on the substrate is shown in FIGS. 7C(a) to 7C(c) and 8(b). In the early stage of the growth (FIG. 7C(a), FIG. 8(b)), crystal portions 21a, 21b are initially grown respectively from the top surfaces 13 of the protrusions and the bottom surfaces 12 of the recess portions that are the portions between the protrusion portions and separated each other in the surface of the substrate. As each of the crystal portions 21a, 21b grows, the height of the crystal portion 21b of the recess 12 exceeds that of the protrusion 13 and a part of the side surfaces and facets of the crystal portions 21a, 21b join together. Thus, as shown in FIG. 7C(b), the crystal portions grown from the protrusions and recesses overlap to form the protrusions 21A, 21B, which are grown from the respective crystal portions. Then the bottom portion of the protrusions 21A, 21B join together to form a layer having a patterned indented surface.

With further crystal growth, the patterned indented surface derived from each of the crystal portions flatten out to form an underlayer 21 with a planar surface, as shown in FIG. 7C(c).

In the present example, the top surface of each protrusion is about 1.5 μm in diameter, the distance between the top surfaces 13 of the protrusions (the distance between the ends of the opposite top surfaces 15) is about 3 μm, the distance between a vertex of the bottom surface 14 of a protrusion and an end 15 of the top surface of the protrusion is about 1 μm, and the cross-sectional width in the vertex direction (the direction between a vertex of the bottom surface and the median point of the triangle of the bottom surface) is about 3 μm. Angles of inclination of the side surface 17 to the top surface 13 or bottom surface 14 of the protrusion are about 80° at a corner of the triangle 14a of the bottom surface and about 63° at a corner between the sides 16-1 and 16-2 of the bottom surface shown in FIG. 2.

A semiconductor element is fabricated by forming, for example as shown in FIG. 9, an n-type layer 22 such as an n-type contact layer, an active layer 23, and a p-type layer 24 on the semiconductor substrate made of the underlayer 21 thus obtained. Specifically, a layered structure (emission wavelength of 465 nm, blue LED) may be used, which is formed by stacking, on the underlayer 21, a first conductive type layer 22 (n-type layer) including an n-side contact layer of GaN doped with Si of $4.5 \times 10^{18}/cm^3$ of 5 μm thickness, a multilayer between the contact layer and an active layer including an undoped GaN layer of 0.3 μm thickness, a GaN layer doped with Si of $4.5 \times 10^{18}/cm^3$ of 0.03 μm thickness, an undoped GaN layer of 5 nm thickness, and ten layers of alternately stacked undoped GaN layer of 4 nm and undoped $In_{0.1}Ga_{0.9}N$ layer of 2 nm, an active layer 23 having a multiple quantum well structure including six layers of alternately stacked a barrier layer of undoped GaN of 25 nm thickness and a well layer of $In_{0.3}Ga_{0.7}N$ of 3 nm thickness, a second conductive type layer (p-type layer) 24 including a p-side multi layer having five layers of alternately stacked $Al_{0.15}Ga_{0.85}N$ layer doped with Mg of $5 \times 10^{19}/cm^3$ of 4 nm thickness and $In_{0.3}Ga_{0.97}N$ layer doped with Mg of $5 \times 10^{19}/cm^3$ of 2.5 nm thickness, and an $Al_{0.15}Ga_{0.85}N$ layer doped with Mg of $5 \times 10^{19}/cm^3$ of 4 nm thickness thereon, and a p-side contact layer of GaN doped with Mg of $1 \times 10^{20}/cm^3$ of 0.12 μm thickness.

On the surface of the p-type layer 24 that is a surface of the light emitting structure, an ITO of about 170 nm thickness is provided as a light transmissive ohmic electrode 41 of the second electrode 40. Then, a first electrode 30 (n-electrode) is provided on the exposed surface of the first conductive type layer (n-side contact layer in the n-type layer) 22s, and a pad electrode 42A and wiring electrodes 42B made of a sequentially stacked film of Rh(about 100 nm)/Pt(about 200 nm)/Au (about 500 nm) extending from the pad electrode are provided on a part of the light transmissive electrode 41. Each of the electrodes is formed into a predetermined shape by way of photolithography, and the first electrode 30 and the pad electrode 42A of the second electrode 40 are used as external terminals. Then, the LED chips are obtained by dividing the wafer into light emitting elements of approximately 350 μm square. Suitable scattering and diffraction of light, as shown in FIG. 9, can be obtained by providing the protrusions 11 on the semiconductor layer 20 side of the substrate as shown in FIG. 6(b), so that light output power can be improved. The protrusions 11 in FIG. 6(b) are shown larger than the actual size employed in Examples.

The size of each structure shown in the above examples is as follows. The thickness of the substrate 10 is about 50 to 200 μm (about 90 μm in the above example). In the layered structure 20, the thickness of the underlayer 21 is about 1 to 3 μm, the thickness of the n-type semiconductor layer 22 is about 2 to 5 μm, the thickness of the active layer or light emitting layer 23 is 10 to 100 nm, the thickness of the p-type semiconductor layer is about 100 to 300 nm. The height from the exposed surface of the n-type layer 22s to the light emitting structure is about 1 to 3 μm (about 1.5 μm in the above example). The thickness of each of the first layer (first electrode) and the second electrode (lower layer) is about 0.01 to 0.5 μm. The thickness of the second layer and pad electrode is about 0.3 to 1.5 μm. The width or diameter of the external connection portion and the pad electrode is about 50 to 150 μm. The width of the exposed outer circumference of the element 22s is about 5 μm to 30 μm.

Example 2

In Example 2, the substrate is formed as in a similar manner as in Example 1, except that the protrusions 11 are formed with a triangular shape at the top surface of the protrusion 13 and the mask 19 for etching, as shown in FIG. 4. As shown in FIG. 4, a mask 19 and the top surface 13 are configured in a shape rotated by 180° around the median point of the triangle 14a of the bottom surface. Thus, the protrusion 11 having three side surfaces 17-1 to 17-3 corresponding to each side of the top surface 13 and the triangle 14a of the bottom surface. Each size of each part of the protrusion 11 is similar to that in Example 1, except that the top surface of the protrusion is approximately regular triangle with the length of a side of about 1 μm.

Approximately the same crystallinity as in Example 1 can be obtained by growing an underlayer 21 in the same manner as in Example 1, on the substrate having the protrusions 11.

In Examples 1 and 2, the electrode forming side of the semiconductor layer side is arranged as the main light extraction surface by using a light transmissive electrode as the electrode and improvement in the light extraction efficiency due to the recess/protrusion of the substrate is obtained. As in the light emitting device described above (FIG. 10), preferable light extracting efficiency can also be obtained due to the recess/protrusion of the substrate in the light emitting element having a reflecting electrode and the substrate side being the light extraction surface.

Comparative Example 1

In Comparative Example 1, the recesses/protrusions of the substrate are formed by etching using RIE through a mask having approximately the same shape, size, interval, and configuration as in Example 1. In the recess/protrusion structure of the substrate thus obtained, the protrusions have a circular truncated cone shape with approximately 0.9 μm in height and intervals (between the bottom surfaces) of approximately 1 μm. The top and bottom surfaces have approximately circular shapes at the top and bottom surfaces with the respective diameter (cross-sectional width) of approximately 0.6 μm and approximately 2 μm.

On the substrate having the recess/protrusion structure, an underlayer and a semiconductor element structure are stacked, and each electrode is provided as in the similar manner in Example 1 to obtain a light emitting element according to Comparative Example 1.

Here, the light emitting element is formed with a structure and shape different from that in Example, to a 420×240 μm rectangular element as shown in FIG. 11(c).

Example 3

In Example 3, the recess/protrusion structure of the substrate, semiconductor layered structure, electrodes and the like are formed as in a similar manner in Example 1, and a rectangular light emitting element described above is formed.

Radiation properties thus obtained in Comparative Example 1 and Example 3 are shown in FIGS. 11(a) and 11(b), respectively. FIGS. 11(a) respectively show the directivity in the A-A line direction and FIG. 11(b) shows the directivity in the B-B line direction, in the plan view of the element 11(c). Herein, the directivity according to Example 3 is shown in full line and that to Comparative Example is shown in dotted line.

Figure 12:
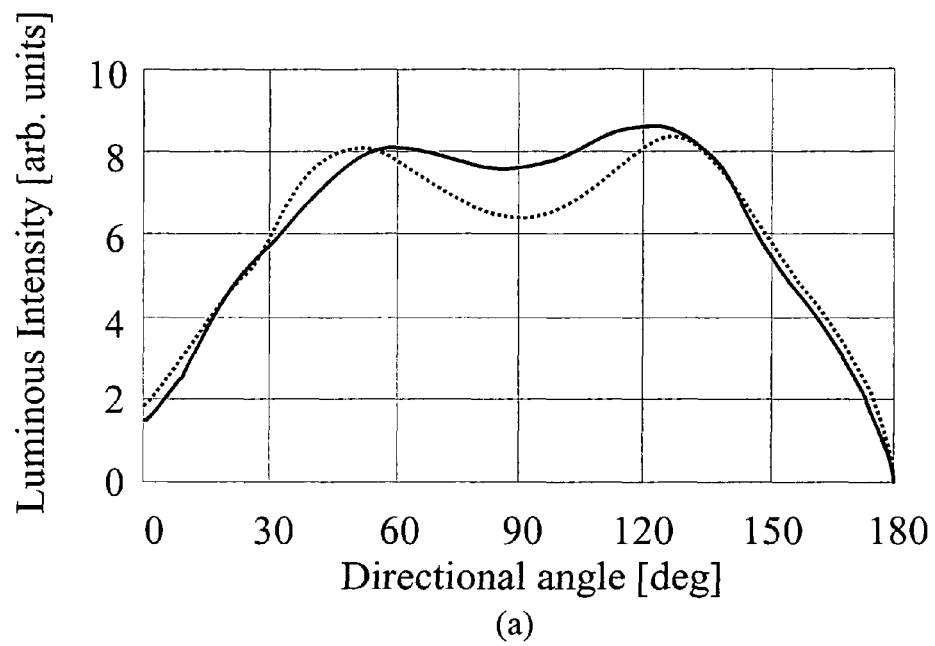
FIGS. 12(*a*) and 12(*b*) are graphs showing radiation properties in a direction along line A-A (FIG. 12(*a*)) and along line B-B (FIG. 12(*b*)), of the light emitting element (FIG. 11(*c*)) according to Example 3 (shown in solid lines) and Comparative Example 1 (shown in dotted lines) according to the present invention.
Figure 12:
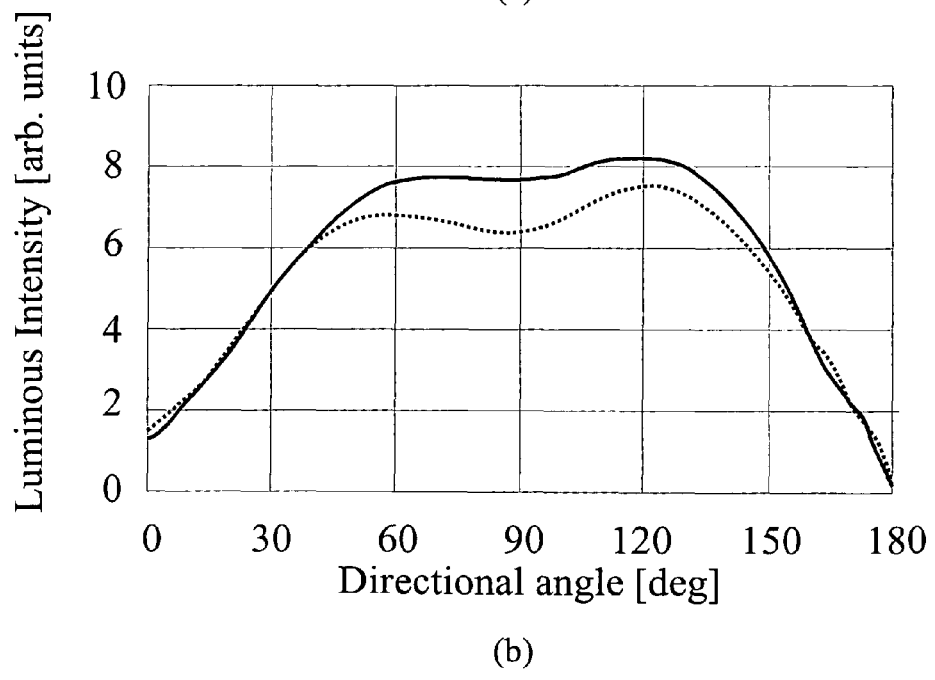

As shown in FIGS. 11(a) and 11(b), Example 3 shows higher directivity than that in Comparative Example 1 in the direction of the optical axis perpendicular (90°) to the element surface. Moreover, ascent of the curve at around 30 to 45° observed in Comparative Example 1 is absent in Example 3. Accordingly, compare to Comparative Example 1, Example 3 shows that the intensity along the axis is increased and the fluctuation in the overall directivity decreased, so that the overall directivity becomes uniform. Thus, a great improvement is obtained. In addition, when a metallic reflection coating (an Al reflecting coating in the example) is provided on the back surface of the substrate of the element, a similar tendency in the radiation properties as shown in FIG. 12 can be observed in Example 3 (solid line in the figure) and in Comparative Example 1 (dotted line in the figure).

In addition, when the underlayer is grown to a thickness of 3 μm and the crystallinity thereof is evaluated by the rocking curve half-width, approximately 20 to 30% decrease can be observed in (1 0 2) and (0 0 2) planes in Example 3 (Example 1) compared to that in Comparative Example 1. Accordingly, it is apparent that a great improvement in the crystallinity is achieved.

Example 4

The recess/protrusion structure is formed on the substrate in a same manner as in Example 1, except that the conditions of etching and masking are varied to obtain the protrusions having a planar shape as shown in FIG. 13. The top surface 13 of the protrusions is approximately circular due to the shape of the approximately circular mask in Example 1 and a intermediate shape between the shapes of the mask and the bottom surface of the protrusion in Example 4. This is considered that the dependency of the top surface 13 of the protrusions to the shape of the mask is decreased by varying the conditions such as the material and adhesiveness of the mask, etching speed, concentration of the solution, so that the top surface has a transitional shape between the shapes of the mask and the bottom surface of the protrusion (constitutive sides of 16-1, 16-2 of the side surfaces 17-1, 17-2, respectively) which is the etching shape of the substrate crystal.

In such case, the shape becomes closer to a circle, that is the mask shape, compared to the shape of the bottom surface of the protrusion, and a longer curved portion 15-b corresponding to the constitutive sides (16-1, 16-2) of the bottom surface of the protrusion and a shorter curved portion 15-a corresponding to the corners of the bottom surface of the protrusion occur at the end portion of the top surface 15. The curvature radius of the curved portion 15-b is smaller than that of corresponding bottom surface of the protrusion. On the one hand, the curved portion 15-a has a further rounded shape than that of the corresponding corner (vertex) of the bottom surface of the protrusion.

Therefore, dependence on the mask shape is lower at the bottom surface side and higher at the top surface side. On the other hand, dependence on the substrate crystal is higher at the bottom surface side and lower at the top surface side.

Figure 14:
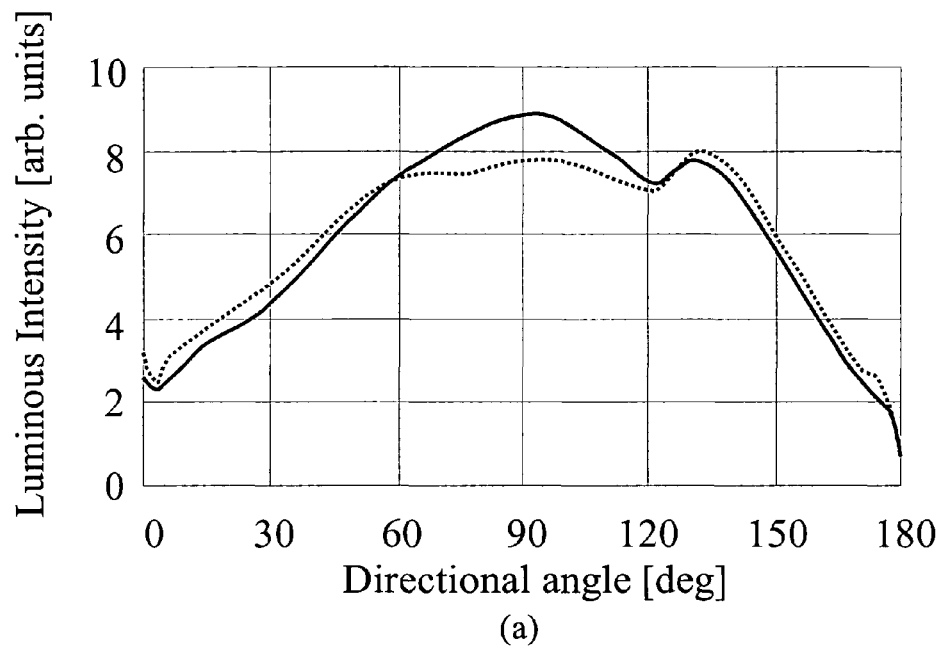
FIGS. 14(*a*) and 14(*b*) are graphs showing radiation properties in a direction along line A-A (FIG. 11(*a*)) and along line B-B (FIG. 6(*a*)), of the light emitting element (FIG. 6(*a*) according to Example 4 (shown in solid lines) and Comparative Example 2 (shown in dotted lines) according to the present invention.
Figure 14:
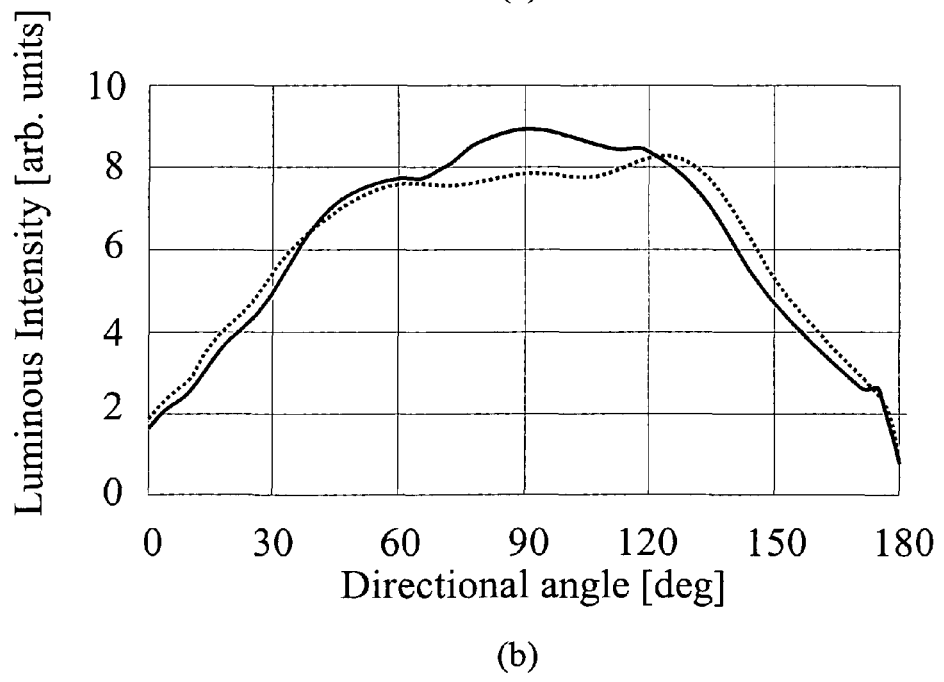

A light emitting element of Example 4 shown in FIG. 6(a) is fabricated in the same manner as in Example 1 and radiation properties are compared to that of Example 1. Each directional characteristics in A-A direction and B-B direction shown in FIG. 6(a) shows, as in FIGS. 14(a) and 14(b), a slight increase in the intensity on the axis (90°) in Example 4 compared to that in Example 1. This is considered that the area of the top surface decreases and in comparison the proportion of the side surface to the planar area increases by varying the shape of the top surface from an approximately circle of the mask shape (Example 1) to an approximately triangle of the substrate crystal shape (Example 4), resulting in increase in the reflected light from the inclined side surfaces.

Examples 5, 6

In Example 4, alignment structures of the protrusions according to Examples 5, 6, shown in FIGS. 15(a), 15(b) respectively, are formed.

In Example 4, the hexagonal arrangement of the mask is 30° rotated. In other words, each of the two axis 11a, 11b are rotated 30° with respect to the planar orientation of the substrate to form the structure. The shape of the bottom surfaces 14 of the protrusions and the constituent sides 16 thereof are formed dependant to the planar orientation of the substrate (A-axis direction indicated by arrows A in the figures). The alignment is then varied accordingly to change in the directions of the protrusions with respect to the periodic structure of the protrusions, i.e., the directions of vertex and constituent sides of the bottom surfaces.

In the periodic arrangements of the protrusions of Example 5 shown in FIG. 15(a) and Example 6 shown in FIG. 15(b), the constituent sides 16 of the bottom surface of the protrusions are arranged intersecting with the aligning direction in the axis directions thereof, and it is different from that in Example 4 and Example 1, Specifically, in the alignments according to Examples 1, 4 shown in FIG. 1, one of the constituent sides 16A, 16B, or 16C of the bottom surfaces is approximately in parallel with the two axis directions 11a, 11b. In the example shown in FIG. 1, the constituent sides 16A are approximately in parallel with the aligning direction 11a, and the constituent sides 16C are approximately in parallel with the aligning direction 11b. On the one hand, according to Examples 5, 6 shown in FIG. 15, all of the constituent sides 16A, 16B, 16C are inclined with respect to the two aligning directions 11a, 11b. In addition, the vertex direction of the bottom surface of the protrusions is inclined with respect to the two alignment directions 11a, 11b, while it is in parallel in the example shown in FIG. 15.

When the constituent sides are disposed inclined with respect to the aligning directions, regions having a low density of the protrusions in terms of reflection of light, which are the regions among the alignments in the above-described directions can be improved. In particular, according to Example 6 shown in FIG. 15(b), regions having a low density are improved by alternately disposing the alignments of protrusions which are arranged adjacent in the alignment direction in the regions among the alignments. In Example 5 shown in FIG. 15(a), the width of each row of the protrusions disposed in the alignment direction is larger than the interval of the rows. On the other hand, in Example 6 shown in FIG. 15(b), the width of the rows B, C in the alignment direction 11b are smaller than that of the interval of the rows. Thus, a part of the rows overlap each other in terms of the width of each row of the protrusions.

As for the emission properties, the radiant flux of the light emitting elements of Examples 5, 6, and Example 4, obtained under the conditions to be described below, is about 29.4 mW in Example 4, 29.7 mW in Example 5, and 29.8 mW in Example 6. Thus, improvement in the region among the rows of the protrusions having a low density described above has been achieved. The radiation properties of a light emitting element having an emission wavelength of about 445 to 450 nm is evaluated by using a light emitting device having a lamp shape, which is a resin mold type with 5 mm in diameter. The protrusions of the light emitting elements of each examples are formed as such that the interval of the periodic structure, the distance between the median points of the bottom surface of adjacent protrusions in Example 4 is formed in a similar manner as that in Example 1, the length of the sides of the triangle 11B is about 4.5 μm and the width of the top surface is about 1.5 μm in an example shown in FIG. 1. In Example 5, the interval of the periodic structures is about 4 μm and the width of the top surface is about 1 μm, in Example 6, the interval of the periodic structures is about 3 μm and the width of the top surface is about 0.9 μm, and the width of the bottom surface of the protrusions is about 2.8 μm in both examples.

INDUSTRIAL APPLICABILITY

The substrate of the present invention can be used not only for the light emitting elements but also for other semiconductor elements to improve the crystallinity of the semiconductor layer. Although the substrate of the present invention is illustrated with the protrusions spaced apart each other, it is also applicable to the recesses of similar configuration.

In the specification, the protrusions of the substrate are formed by processing the substrate, but the protrusions can also be formed on the substrate by providing protrusions with a light transmissive or reflective member, for example, by providing a film or a light transmissive film with a similar material as that of the protective film or the mask. In this case, a material that is not decomposed during the growth of the semiconductor layer is used for the protrusion portion.

What is claimed is:

1. A semiconductor light emitting element comprising a semiconductor light emitting structure on a first main surface of a substrate, wherein
   the first main surface of the substrate has a substrate protrusion portion thereon, wherein a bottom surface of a protrusion is wider than a top surface thereof in a cross section of the substrate and the top surface is included in the bottom surface in a top view of the substrate,
   the bottom surface has an approximately polygonal shape which has a convex portion on each constituent side of the bottom surface, and
   the top surface has an approximately circular shape.

2. The semiconductor light emitting element according to claim 1, wherein a plurality of protrusions are present, are spaced apart from each other and are arranged periodically on the first main surface.

3. The semiconductor light emitting element according to claim 2, wherein the periodic arrangement of the protrusions is a triangular, quadrangular, or hexagonal lattice.

4. A semiconductor light emitting element comprising a semiconductor light emitting structure on a first main surface of a substrate, wherein the first main surface of the substrate has a substrate protrusion portion thereon, wherein a bottom surface of a protrusion is wider than a top surface thereof in a cross section of the substrate and the top surface is included in the bottom surface in a top view of the substrate, the bottom surface has an approximately polygonal shape, and the top surface has an approximately polygonal shape which has a number of constituent sides the same or less than that of constituent sides of the bottom surface and has a different contour from that of the bottom surface, and wherein the number of side surfaces of the protrusion is larger than the number of constituent sides of the approximately polygonal bottom surface.

5. The semiconductor light emitting element according to claim 1, wherein the shape of the bottom surface is approximately triangular.

6. The semiconductor light emitting element according to claim 5, wherein a plurality of protrusions are present and are arranged in an aligning structure having the protrusions arranged in two directions, such that a direction of the aligned constituent sides of the bottom triangular surfaces of the protrusions intersects with a direction of the vertexes of the triangular bottom surfaces, and wherein the direction of the vertexes are approximately parallel to that of the aligning structure.

7. The light emitting element according to claim 6, wherein a row of aligned protrusions having a width defined by a distance between two vertexes of each protrusion overlaps with an adjacent row having a width defined by a distance between two vertexes of each protrusion in the aligning structure.

8. A semiconductor light emitting element comprising a semiconductor light emitting structure on a first main surface of a substrate, wherein the first main surface of the substrate has a substrate protrusion portion on the first main surface of the substrate, a bottom surface of the protrusion is wider than a top surface thereof in a cross section of the substrate, and the top surface is included in the bottom surface in a top view of the substrate, wherein the shape of the bottom surface is approximately Reuleaux polygon.

9. The semiconductor light emitting element according to claim 8, wherein the protrusion has an upper surface having a shape of approximately a curve of constant width, a circle, or a Reuleaux polygon, which is a different shape than the shape of the bottom surface.

10. The semiconductor light emitting element according to claim 9, wherein the top surface has a longer convex portion corresponding to a side of the bottom surface, a shorter convex portion which corresponds to a corner of the bottom surface, and a shorter length than a length of the longer portion.

11. The semiconductor light emitting element according to claim 10, wherein the longer convex portion has a curvature radius smaller than that of the side of the bottom surface corresponding to the longer convex portion.

12. A semiconductor light emitting element comprising a semiconductor light emitting structure on a first main surface of a substrate, wherein the first main surface of the substrate has a substrate protrusion portion, a bottom surface of a protrusion is wider than a top surface thereof in a cross section of the substrate, the top surface is included in the bottom surface in a top view of the substrate, the bottom surface has vertexes of a polygonal crystal shape on the substrate and a convex portion projected outwardly on each side of the polygonal crystal shape, wherein the top surface has a different contour from that of the bottom surface.

13. The semiconductor light emitting element according to claim 12, wherein the bottom surface has two constituent sides provided on each side of the polygonal crystal shape.

14. The semiconductor light emitting element according to claim 13, wherein each side surface of the protrusion has a convex portion projected outwardly on each side of the polygonal crystal shape.

15. The semiconductor light emitting element according to claim 14, wherein the protrusion has an upper surface having a shape of approximately a curve of constant width, a circle, or a Reuleaux polygon.

* * * * *